(12) United States Patent
Kida et al.

(10) Patent No.: US 11,966,527 B2
(45) Date of Patent: *Apr. 23, 2024

(54) DISPLAY PANEL WITH TOUCH DETECTION FUNCTION, DRIVE CIRCUIT, AND ELECTRONIC UNIT

(71) Applicant: Japan Display Inc., Tokyo (JP)

(72) Inventors: Yoshitoshi Kida, Kanagawa (JP); Koji Noguchi, Kanagawa (JP); Hiroshi Mizuhashi, Kanagawa (JP); Kohei Azumi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/111,650

(22) Filed: Feb. 20, 2023

(65) Prior Publication Data
US 2023/0205339 A1 Jun. 29, 2023

Related U.S. Application Data

(63) Continuation of application No. 17/666,674, filed on Feb. 8, 2022, now Pat. No. 11,620,013, which is a continuation of application No. 16/706,268, filed on Dec. 6, 2019, now Pat. No. 11,281,319, which is a continuation of application No. 16/025,368, filed on Jul. 2, 2018, now Pat. No. 10,540,031, which is a continuation of application No. 15/818,411, filed on Nov. 20, 2017, now Pat. No. 10,042,454, which is a
(Continued)

(30) Foreign Application Priority Data

Apr. 13, 2011 (JP) .................................. 2011-089430

(51) Int. Cl.
G06F 3/041 (2006.01)
G06F 3/044 (2006.01)
H03K 17/96 (2006.01)
G02F 1/1333 (2006.01)

(52) U.S. Cl.
CPC .......... *G06F 3/0412* (2013.01); *G06F 3/0445* (2019.05); *G06F 3/0446* (2019.05); *H03K 17/9622* (2013.01); *G02F 1/13338* (2013.01); *H03K 2217/96031* (2013.01)

(58) Field of Classification Search
CPC .... G06F 3/0412; G06F 3/0445; G06F 3/0446; G06F 1/1626; G06F 3/0416; G06F 3/044; H03K 17/9622; H03K 2217/96031; G02F 1/13338
See application file for complete search history.

(56) References Cited

U.S. PATENT DOCUMENTS

| 2010/0194697 | A1* | 8/2010 | Hotelling | G06F 3/0412 345/55 |
| 2010/0295804 | A1* | 11/2010 | Takeuchi | G02F 1/13338 345/173 |
| 2011/0242050 | A1* | 10/2011 | Byun | G06F 3/0443 345/174 |

* cited by examiner

Primary Examiner — Jonathan A Boyd
(74) Attorney, Agent, or Firm — Michael Best & Friedrich LLP

(57) ABSTRACT

There are provided a display panel with a touch detection function, a drive circuit, and an electronic unit, which make it possible to realize many functions related to touch detection. The display panel includes: one or more display elements; one or more drive electrodes extending in one direction; an electrode drive section integrated into a chip, and applying a drive signal to the drive electrodes; and one or more touch detection electrodes extending in a direction intersecting the direction in which the drive electrodes extend.

5 Claims, 19 Drawing Sheets

Related U.S. Application Data continuation of application No. 13/420,669, filed on Mar. 15, 2012, now Pat. No. 9,851,824.

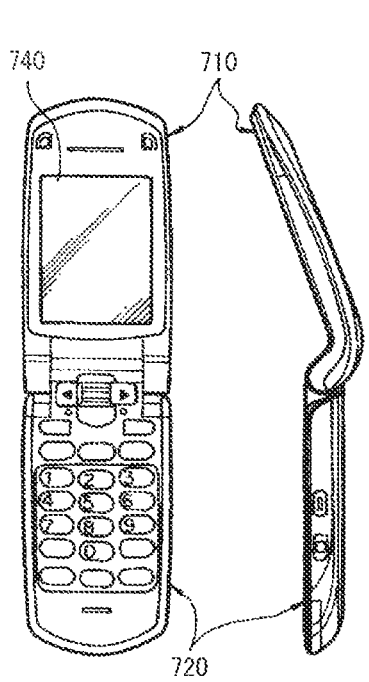
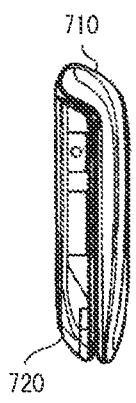
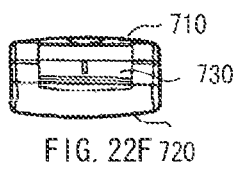
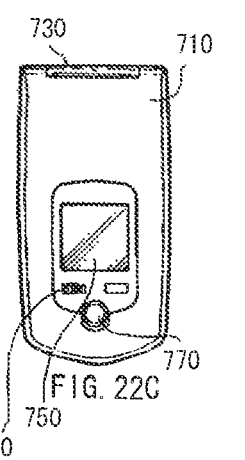
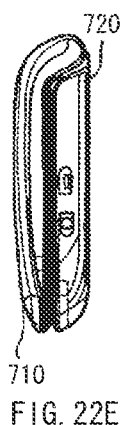
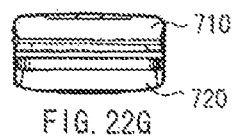

DISPLAY PANEL WITH TOUCH DETECTION FUNCTION, DRIVE CIRCUIT, AND ELECTRONIC UNIT

CROSS-REFERENCE TO RELATED APPLICATIONS

The present application is a Continuation of application Ser. No. 17/666,674, filed Feb. 8, 2022, which is a Continuation of application Ser. No. 16/706,268, filed Dec. 6, 2019, now U.S. Pat. No. 11,281,319, issued Mar. 22, 2022, which is a Continuation of application Ser. No. 16/025,368, filed Jul. 2, 2018, now U.S. Pat. No. 10,540,031, issued Jan. 21, 2020, which is a Continuation of application Ser. No. 15/818,411, filed Nov. 20, 2017, now U.S. Pat. No. 10,042,454, issued Aug. 7, 2018, which is a Continuation of application Ser. No. 13/420,669, filed Mar. 15, 2012, now U.S. Pat. No. 9,851,824, issued Dec. 26, 2017, and claims priority from Japanese Application No. 2011-089430, filed on Apr. 13, 2011, the contents of which are incorporated by reference herein in their entirety.

BACKGROUND

The present disclosure relates to a display panel with a touch detection function which detects a touch event by an external proximity object, a drive circuit thereof, and an electronic unit having such a display panel with a touch detection function.

In recent years, attention has been given to a display panel configured by mounting a contact sensing device, a so-called touch panel, on a display such as a liquid crystal display or the like, or integrating the touch panel and the display, thereby causing the display to display various button images and the like to enable information input, in place of ordinary mechanical buttons. The display panel having such a touch panel is allowed not to have an input device such as a keyboard, a mouse, or a keypad and therefore, there is a growing trend to use the display panel in a portable information terminal such as a portable telephone, in addition to a computer.

There are some types of the touch panel, including an optical type, a resistive type, and a capacitance type. For example, Japanese Unexamined Patent Application Publication No. 2009-258182 has proposed a so-called in-cell type display panel with a touch detection function. According to this document, in a capacitance-type touch panel, a common electrode for display originally provided in a display is used as one of a pair of touch sensor electrodes, and the other (a touch detection electrode) is disposed to intersect this common electrode. In this display panel with a touch detection function, an AC signal applied to this common electrode is transmitted to the touch detection electrode via a capacitance between the common electrode and the touch detection electrode. Then, a touch event is detected based on a detection signal outputted from the touch detection electrode. A drive circuit that performs driving by applying this AC signal to the common electrode is formed on a TFT board made of glass or the like.

SUMMARY

Incidentally, it has been desired that such a display panel with a touch detection function have more functions related to touch detection. However, Japanese Unexamined Patent Application Publication No. 2009-258182 provides no specific description about an attempt to achieve multifunctionality.

In view of the foregoing, it is desirable to provide a display panel with a touch detection function, a drive circuit, and an electronic unit, which make it possible to realize many functions related to touch detection.

According to an embodiment of the present disclosure, there is provided a first display panel with a touch detection function, the first display panel including one or more display elements; one or more drive electrodes extending in one direction; an electrode drive section integrated into a chip, and applying a drive signal to the drive electrodes; and one or more touch detection electrodes extending in a direction intersecting the direction in which the drive electrodes extend.

According to another embodiment of the present disclosure, there is provided a second display panel with a touch detection function, the second display panel including one or more display elements; one or more touch detection elements; and a drive section integrated into a chip, and driving the one or more touch detection elements.

According to another embodiment of the present disclosure, there is provided a drive circuit including a display drive section driving one or more display elements; and an electrode drive section integrated into a chip, and applying a drive signal to one or more drive electrodes that extend in a direction intersecting a direction in which one or more touch detection electrodes extend.

According to another embodiment of the present disclosure, there is provided an electronic unit including the display panel with a touch detection function and a control section performing operation control using the display panel, the display panel including: one or more display elements; one or more drive electrodes extending in a direction; an electrode drive section integrated into a chip, and applying a drive signal to the drive electrodes; and one or more touch detection electrodes extending in a direction intersecting the direction in which the drive electrodes extend. For example, a television receiver, a digital camera, a personal computer, a video camera, a portable terminal device such as a portable telephone, or the like corresponds to this electronic unit.

In the first and second display panels, the drive circuit, and the electronic unit according to the above-described embodiments of the present disclosure, the drive signal is applied to the drive electrode by the electrode drive section, and a detection signal according to the drive signal is outputted from the touch detection electrode. This electrode drive section is integrated into the chip.

According to the first and second display panels, the drive circuit, and the electronic unit in the above-described embodiments of the present disclosure, the electrode drive section is integrated into the chip and thus, it is possible to realize many functions related to touch detection.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

Parts (A) and (B) of FIG. 1 are diagrams for explaining a basic principle of a touch detection scheme in a display panel with a touch detection function according to an embodiment of the present disclosure, and illustrate a state in which there is no touch or approach of a finger.

Figure 2:
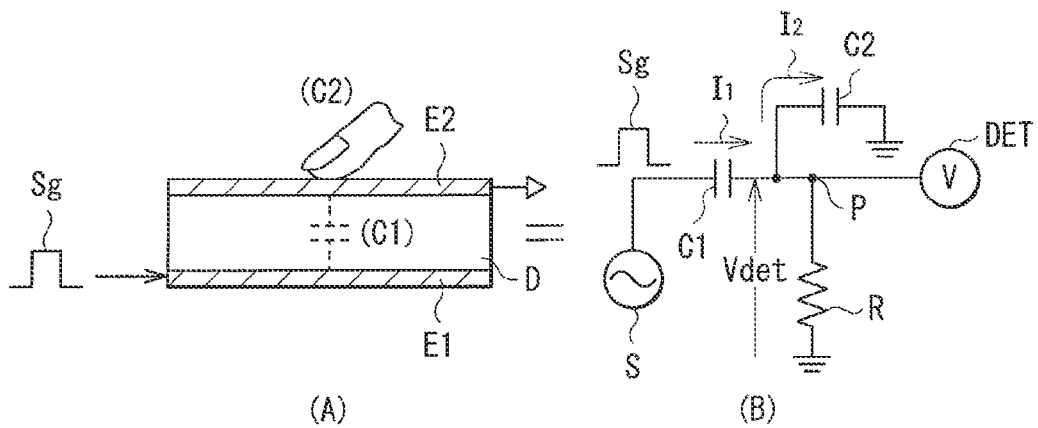

Parts (A) and (B) of FIG. 2 are diagrams for explaining the basic principle of the touch detection scheme in the display panel with a touch detection function according to the embodiment of the present disclosure, and illustrate a state in which there is a touch or an approach of the finger.

Figure 3:
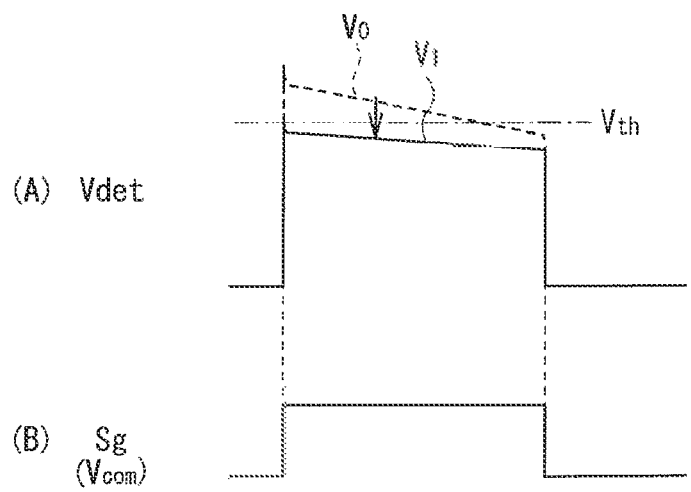

Parts (A) and (B) of FIG. 3 are diagrams for explaining the basic principle of the touch detection scheme in the display panel with a touch detection function according to the embodiment of the present disclosure, and illustrate an example of a waveform of a drive signal and an example of a waveform of a touch detection signal, respectively.

Figure 4:
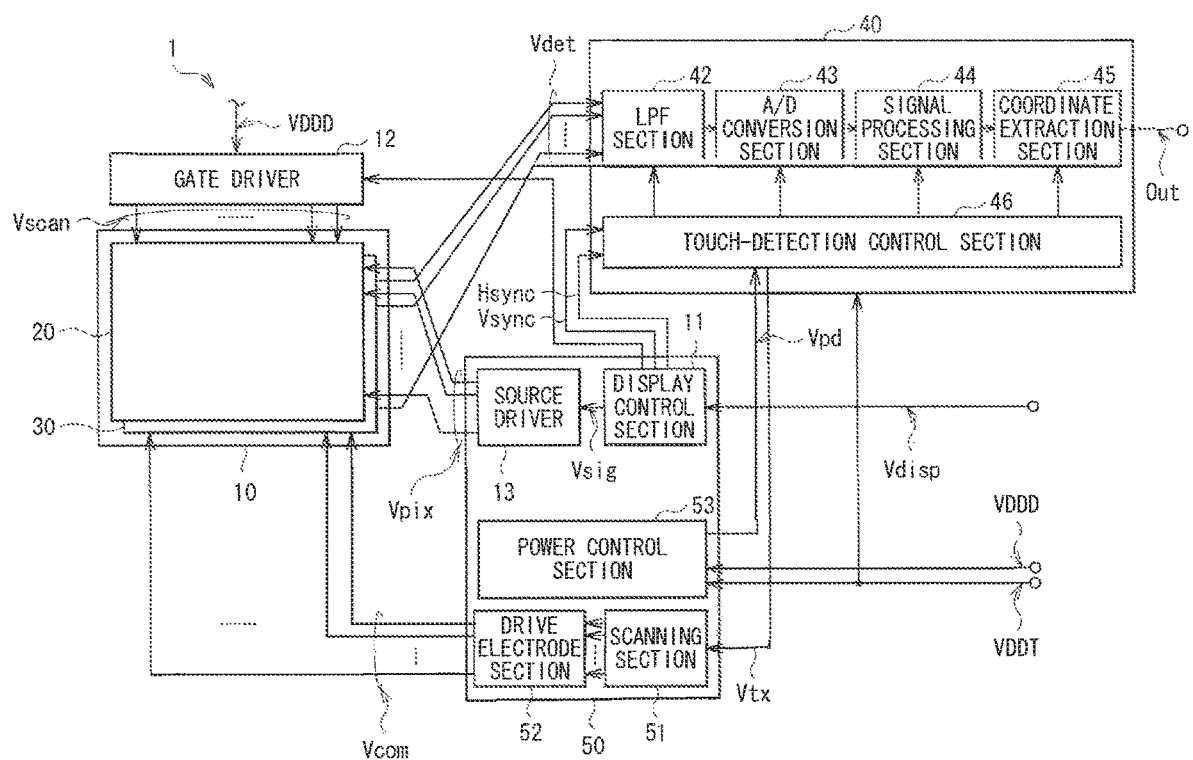

FIG. 4 is a block diagram illustrating a configuration example of a display panel with a touch detection function according to an embodiment of the present disclosure.

Figure 5:
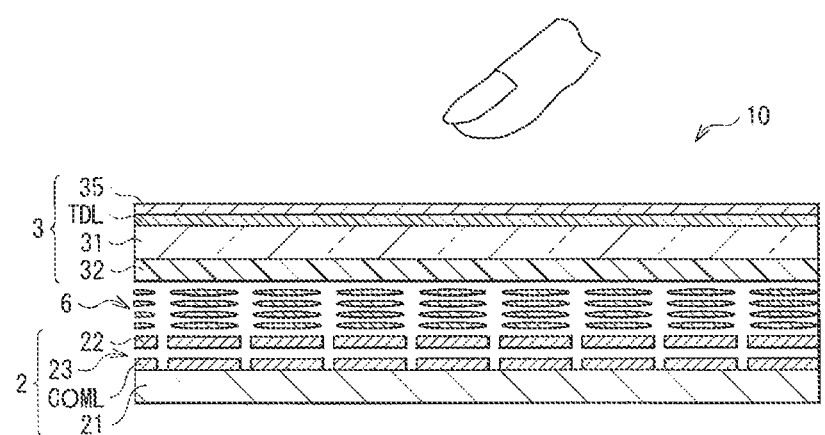

FIG. 5 is a cross-sectional diagram illustrating a schematic sectional structure of a display device with a touch detection function illustrated in FIG. 4.

Figure 6:
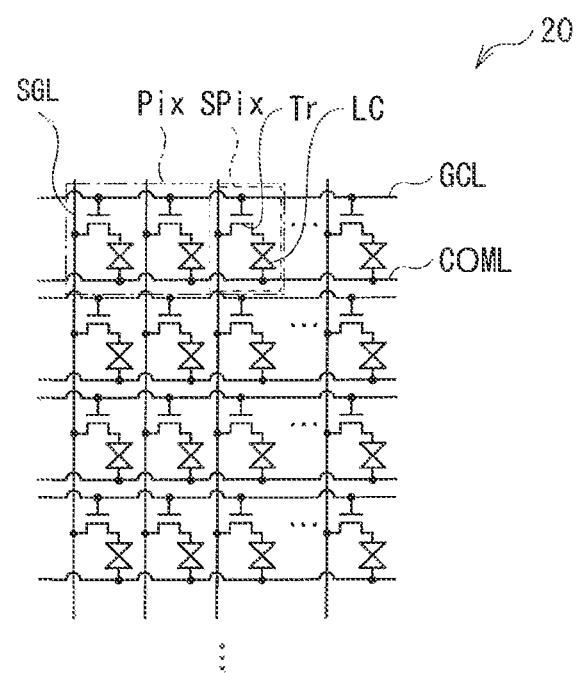

FIG. 6 is a circuit diagram illustrating a pixel arrangement in the display device with a touch detection function illustrated in FIG. 4.

Figure 7:
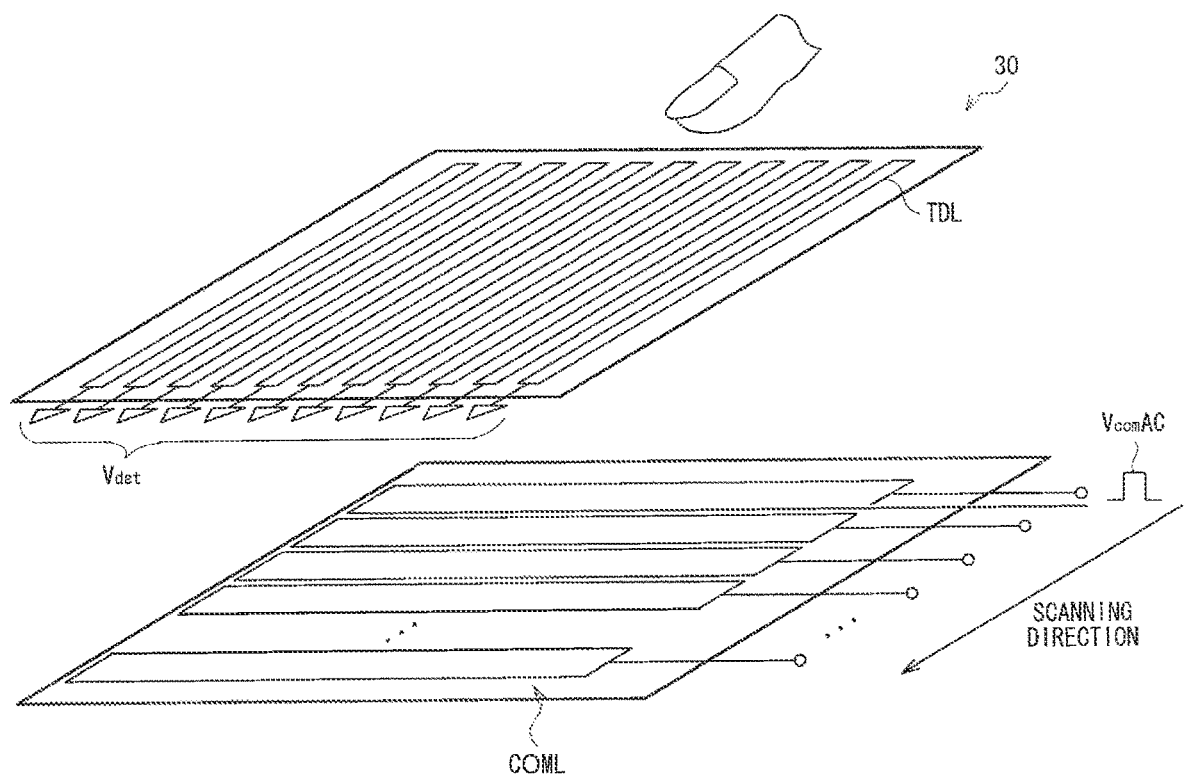

FIG. 7 is a perspective diagram illustrating a configuration example of drive electrodes and touch detection electrodes in the display device with a touch detection function illustrated in FIG. 4.

Figure 8A:
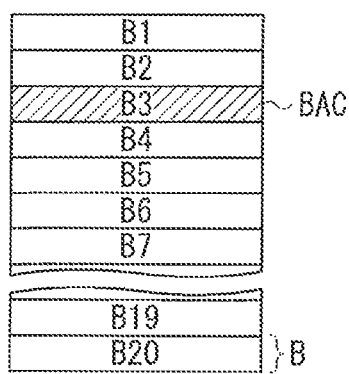
Figure 8B:
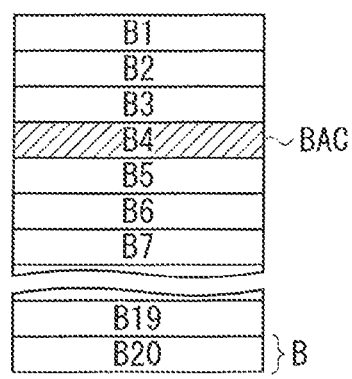
Figure 8C:
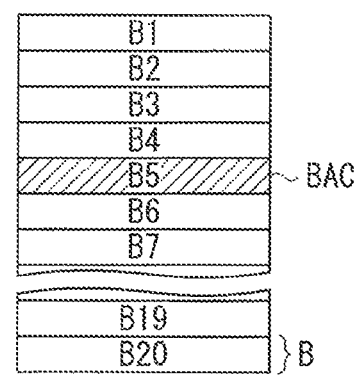

FIGS. 8A to 8C are schematic diagrams illustrating an operation example of touch detection scanning in the display panel with a touch detection function illustrated in FIG. 4.

Figure 9:
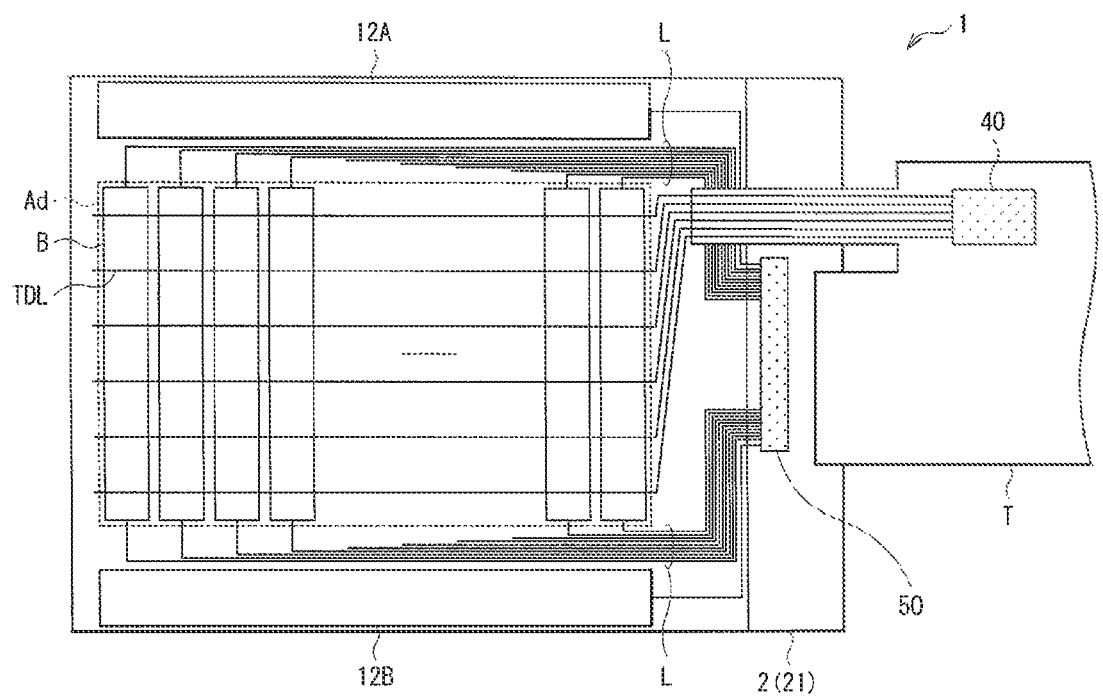

FIG. 9 is a schematic diagram illustrating an implementation example of the display panel with a touch detection function illustrated in FIG. 4.

Figure 10:
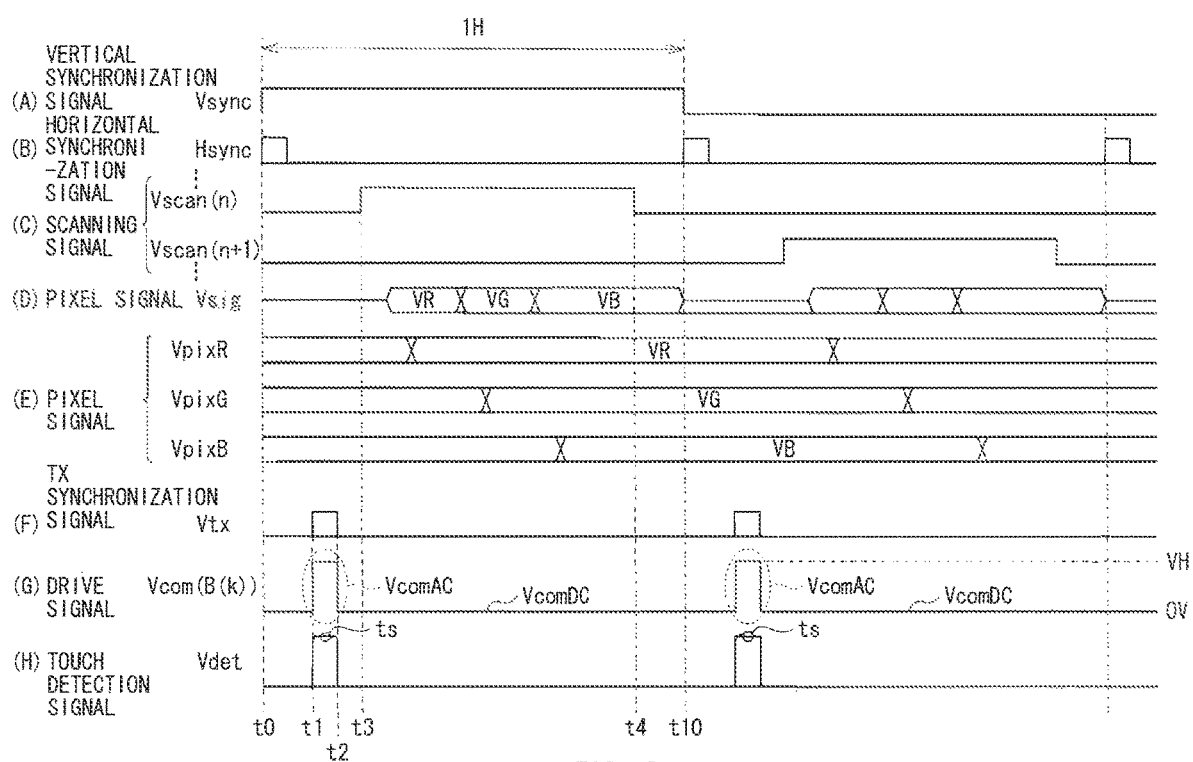

Parts (A) to (H) of FIG. 10 are timing waveform charts illustrating an operation example of the display panel with a touch detection function illustrated in FIG. 4.

Figure 11:
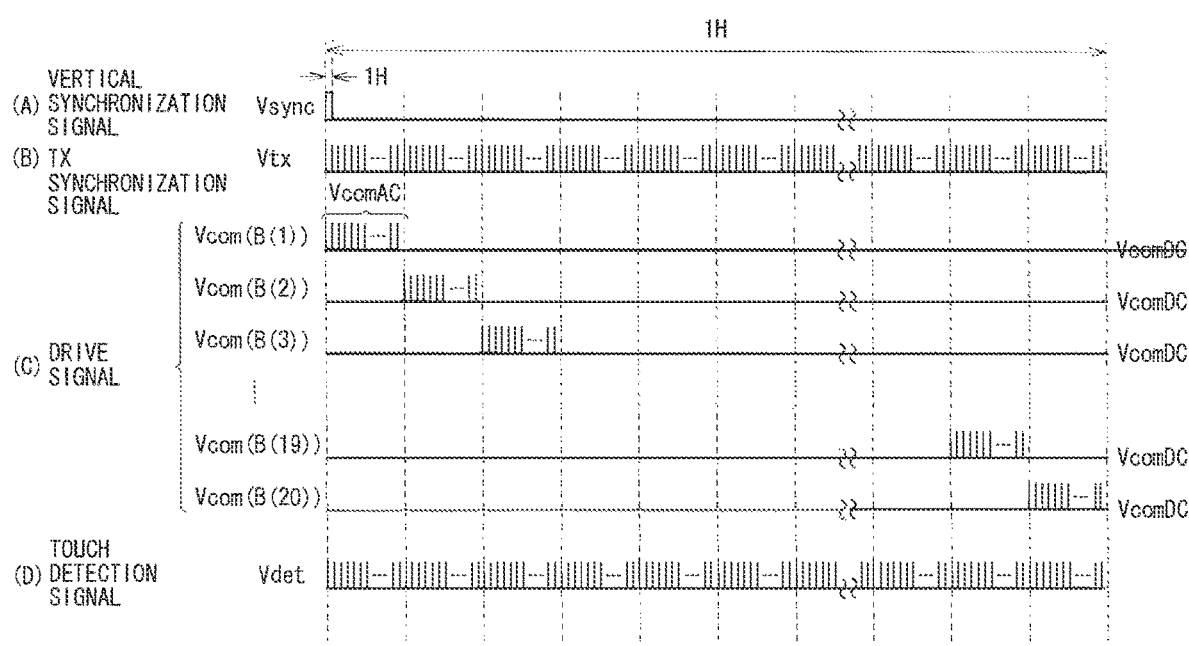

Parts (A) to (D) of FIG. 11 are timing waveform charts illustrating an example of touch detection operation in the display panel with a touch detection function illustrated in FIG. 4.

Figure 12:
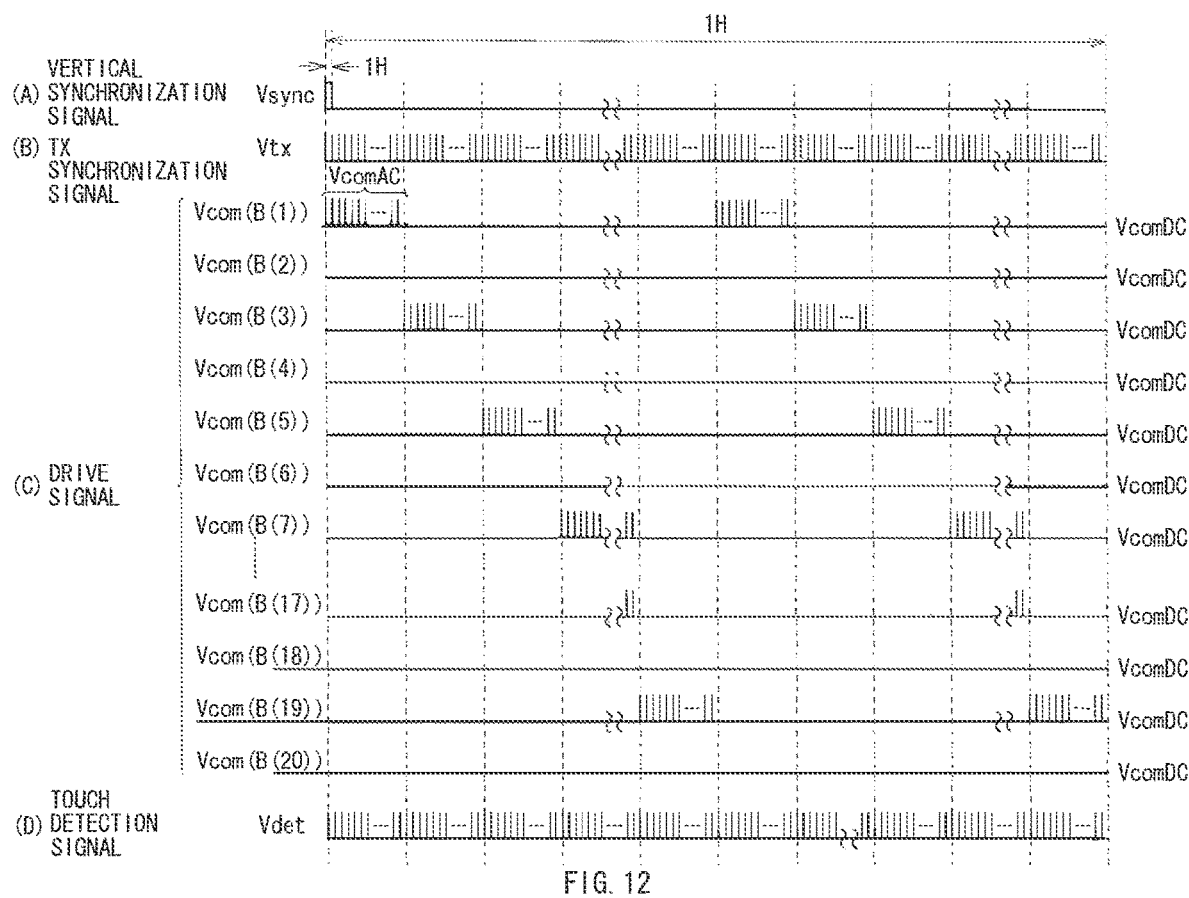

Parts (A) to (D) of FIG. 12 are timing waveform charts illustrating another example of the touch detection operation in the display panel with a touch detection function illustrated in FIG. 4.

Figure 13A:
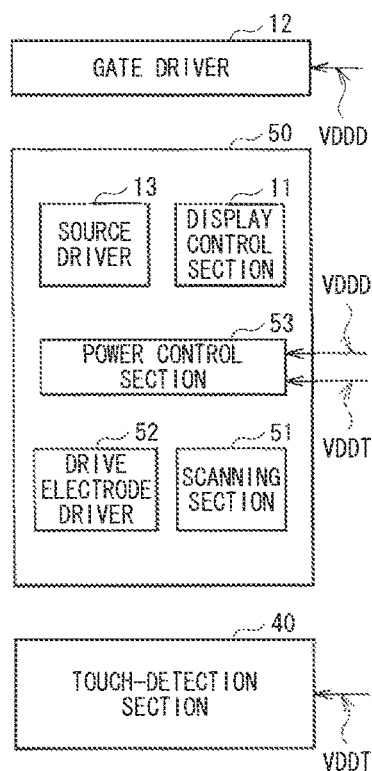
Figure 13B:
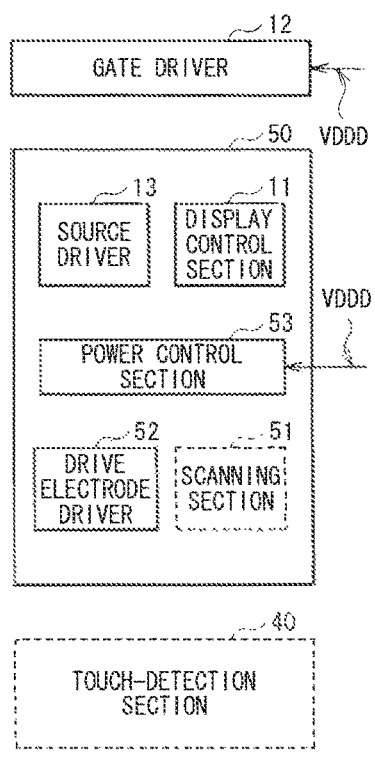
Figure 13C:
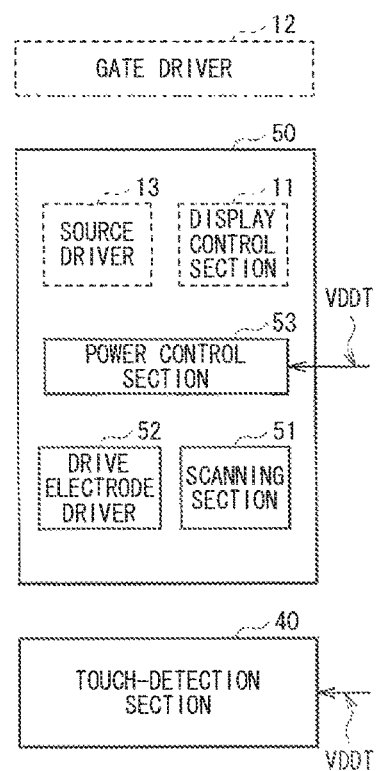

FIGS. 13A to 13C are explanatory diagrams each illustrating an example of power supply control in the display panel with a touch detection function illustrated in FIG. 4.

Figure 14A:
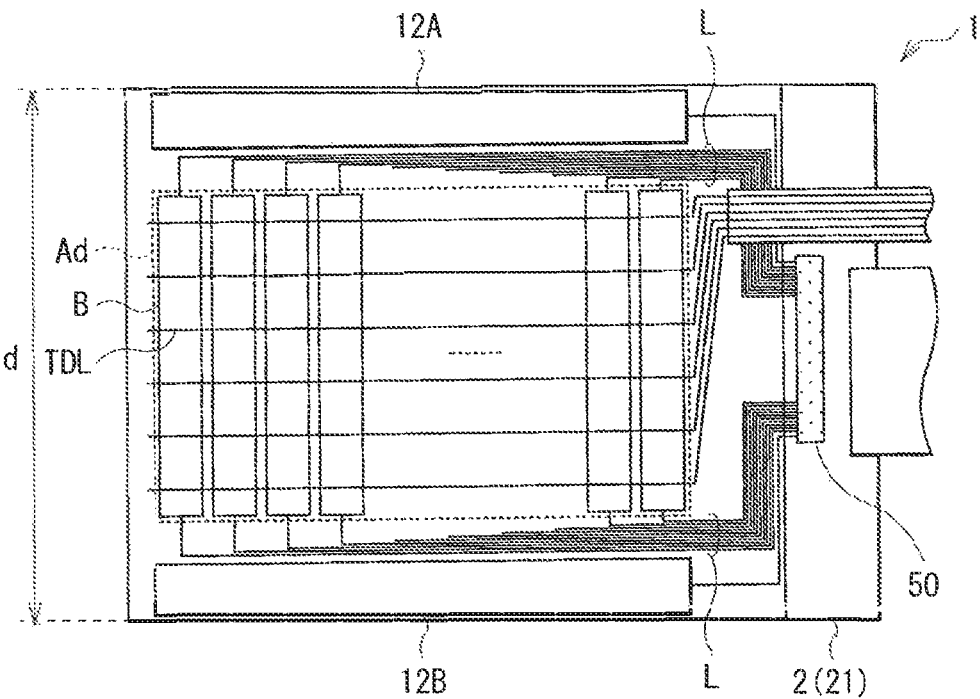
Figure 14B:
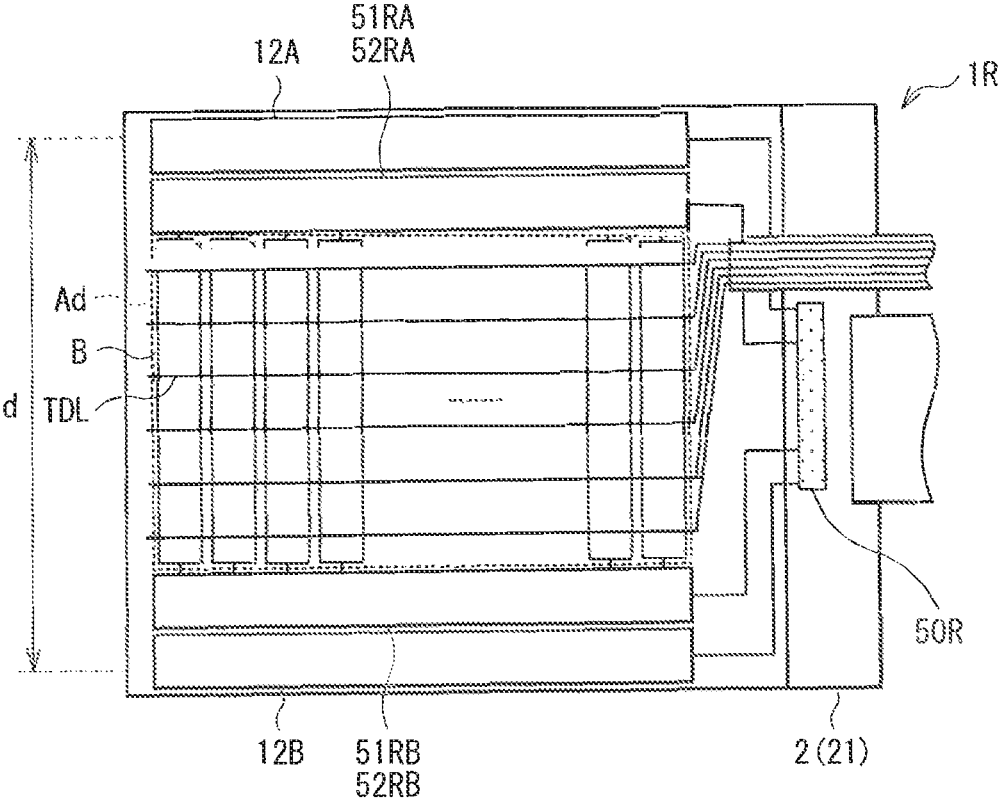

FIGS. 14A and 14B are schematic diagrams each illustrating an implementation example of the display panel with a touch detection function.

Figure 15:
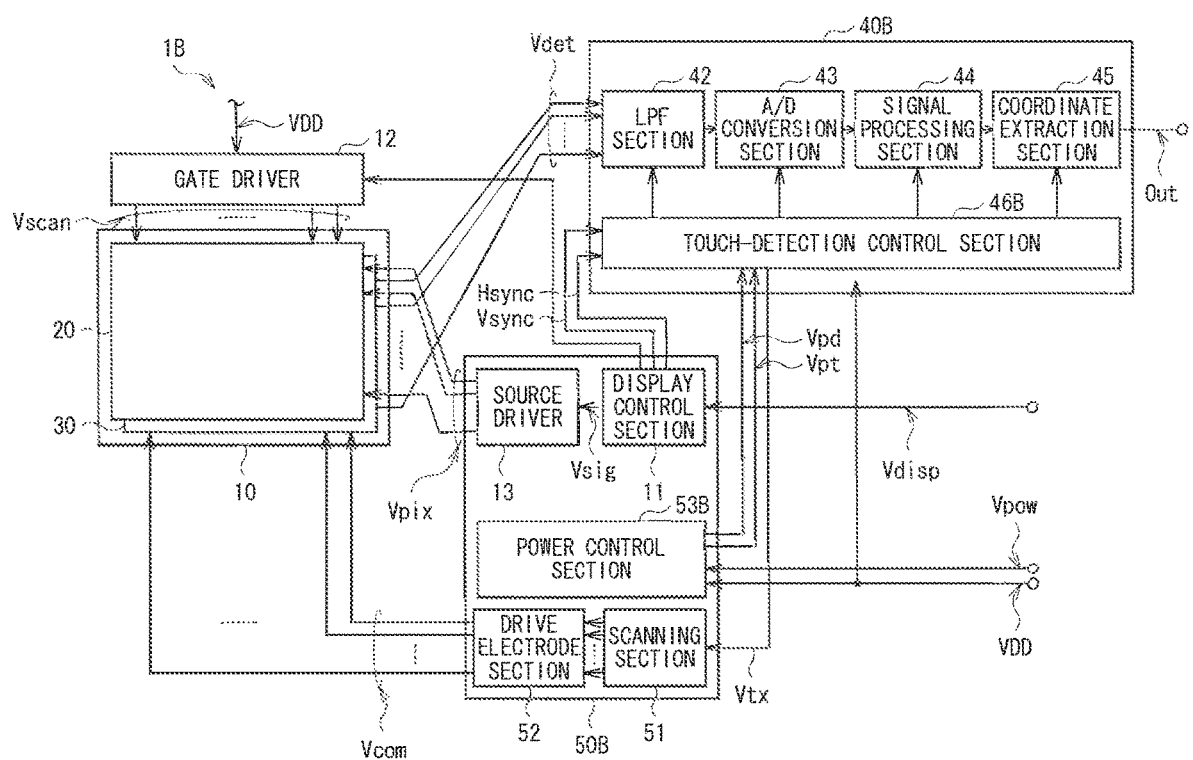

FIG. 15 is a block diagram illustrating a configuration example of a display panel with a touch detection function according to a modification of the embodiment.

Figure 16A:
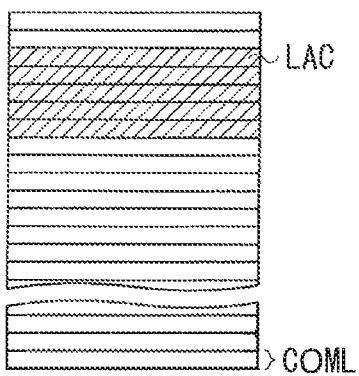
Figure 16B:
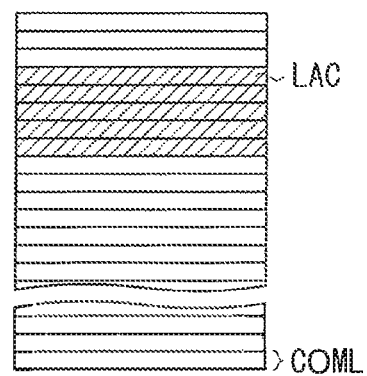
Figure 16C:
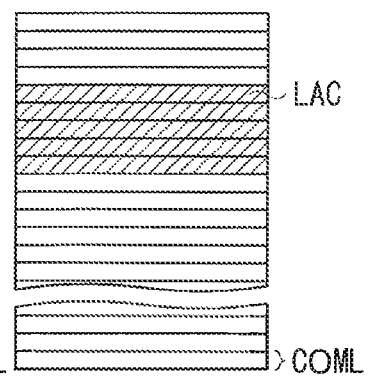

FIGS. 16A to 16C are schematic diagrams illustrating an operation example of touch detection scanning in a display panel a touch detection function according to another modification of the embodiment.

Figure 17:
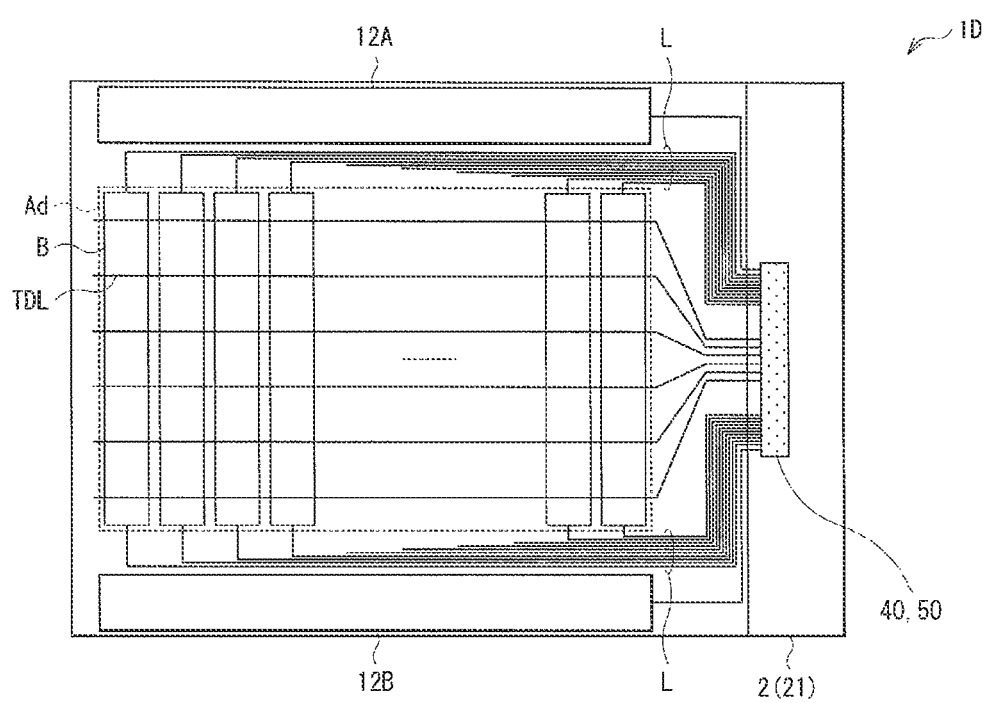

FIG. 17 is a schematic diagram illustrating an implementation example of a display panel with a touch detection function according to still another modification of the embodiment.

Figure 18:
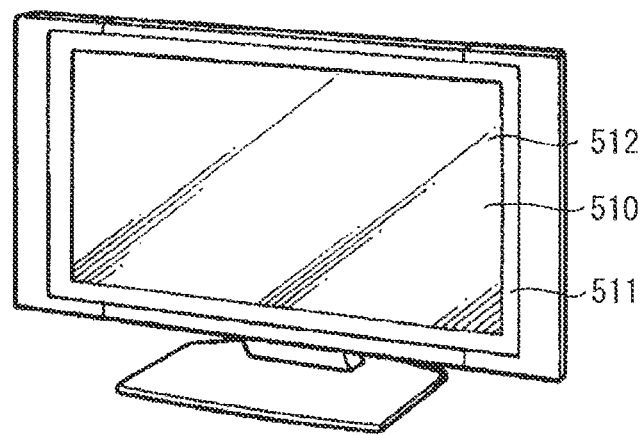

FIG. 18 is a perspective view illustrating a configuration of an appearance of an application example 1, among display panels each provided with a touch detection function, to which the embodiment is applied.

Figure 19A:
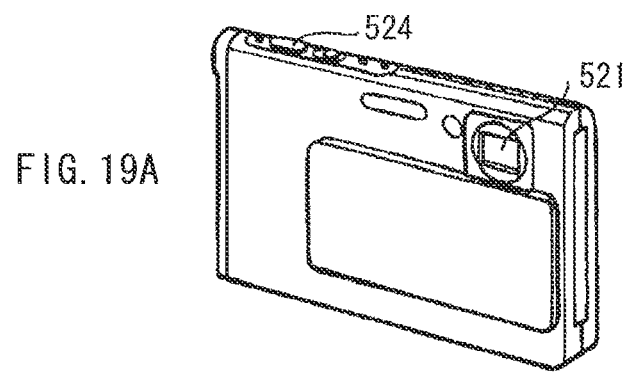
Figure 19B:
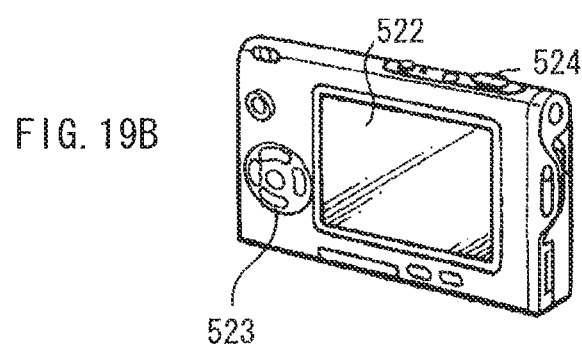

FIGS. 19A and 19B are perspective views each illustrating a configuration of an appearance of an application example 2.

Figure 20:
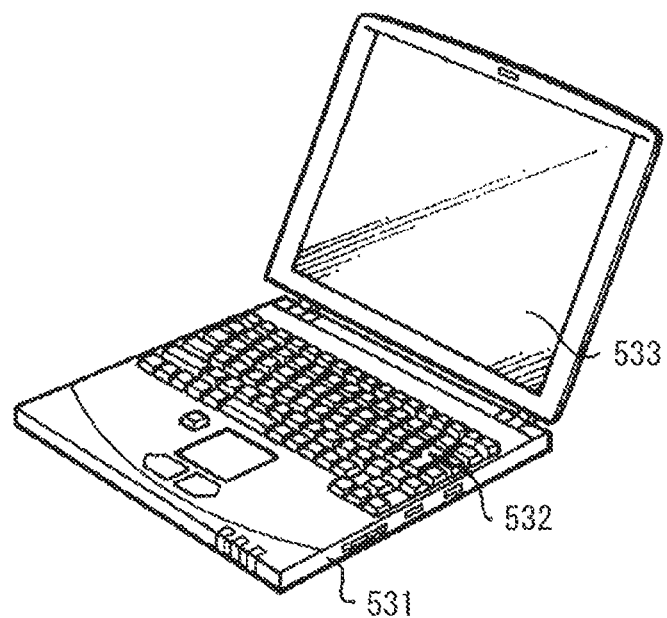

FIG. 20 is a perspective view illustrating a configuration of an appearance of an application example 3.

Figure 21:
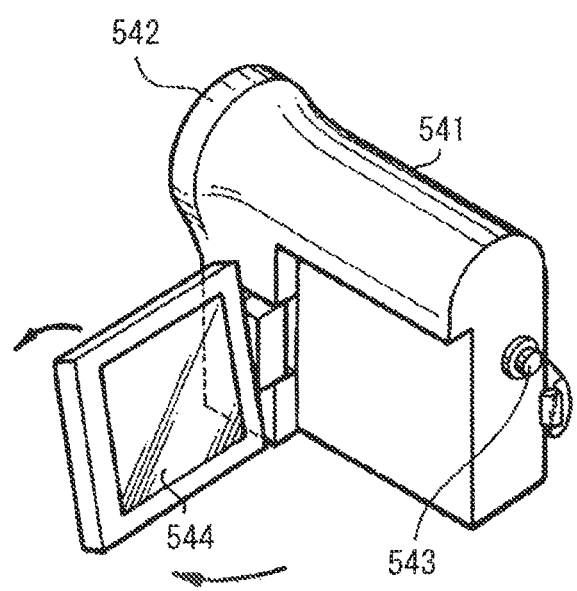

FIG. 21 is a perspective view illustrating a configuration of an appearance of an application example 4.

FIGS. 22A to 22G are front views, side views, a top view, and a bottom view each illustrating a configuration of an appearance of an application example 5.

Figure 23:
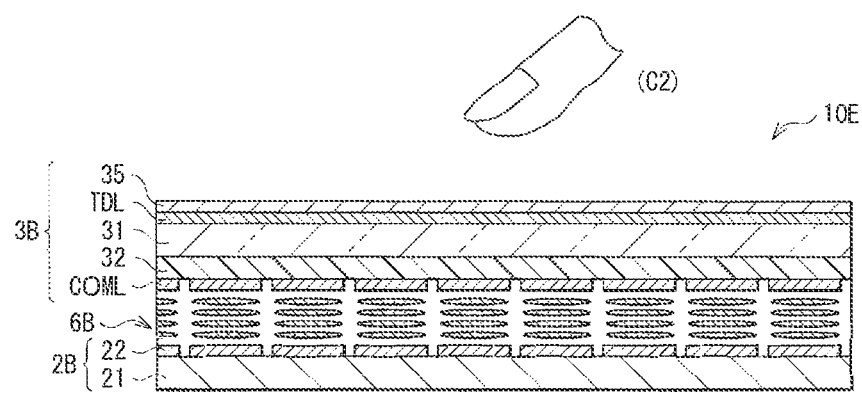

FIG. 23 is a cross-sectional diagram illustrating a schematic sectional structure of a display device with a touch detection function according to a modification.

DETAILED DESCRIPTION OF EMBODIMENT

An embodiment of the present disclosure will be described below in detail with reference to the drawings. Incidentally, the description will be provided in the following order.
1. Basic Principle of Capacitance-Type Touch Detection
2. Embodiment
3. Application Examples
(1. Basic Principle of Capacitance-Type Touch Detection)

At first, with reference to Parts (A) and (B) of each of FIG. 1 to FIG. 3, there will be described a basic principle of touch detection in a display panel with a touch detection function according to an embodiment of the present disclosure. This touch detection scheme is embodied as a capacitance-type touch sensor, and forms a capacitive element by using, as illustrated in, for example, Part (A) of FIG. 1, a pair of opposed electrodes (a drive electrode E1 and a touch detection electrode E2) with a dielectric body D in between. This structure is expressed as an equivalent circuit illustrated in Part (B) of FIG. 1. A capacitive element C1 is configured by using the drive electrode E1, the touch detection electrode E2, and the dielectric body D. Of the capacitive element C1, one end is connected to an AC-signal source (drive signal source) S, and the other end P is grounded via a resistor R and also connected to a voltage detector (touch detection circuit) DET. When an AC rectangular wave Sg (Part (B) of FIG. 3) of a predetermined frequency (for example, around several kHz to tens kHz) is applied to the drive electrode E1 (the one end of the capacitive element C1) from the AC-signal source S, an output waveform (a touch detection signal Vdet) as illustrated in Part (A) of FIG. 3 appears in the touch detection electrode E2 (the other end P of the capacitive element C1). It is to be noted that this AC rectangular wave Sg is equivalent to an AC drive signal VcomAC to be described later.

Figure 1:
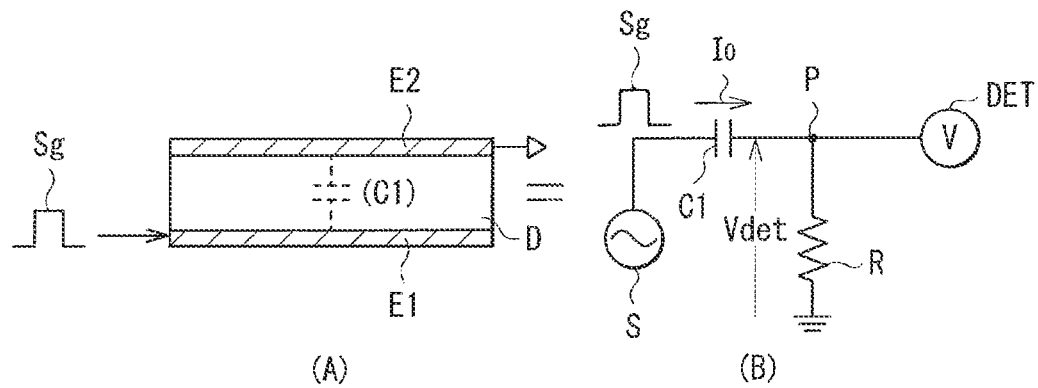

In a state in which there is no touch (or approach) of a finger, an electric current I0 according to a capacitance value of the capacitive element C1 flows, accompanying charge and discharge for the capacitive element C1, as illustrated in Parts (A) and (B) of FIG. 1. An electric potential waveform at the other end P of the capacitive element C1 at this moment is, for example, like a waveform V0 in Part (A) of FIG. 3, and this is detected by the voltage detector DET.

On the other hand, in a state in which there is a touch (or an approach) of a finger, a capacitive element C2 formed by the finger is added to the capacitive element C1 in series, as illustrated in Parts (A) and (B) of FIG. 2. In this state, currents I1 and I2 flow, accompanying charge and discharge for the capacitive elements C1 and C2, respectively. An electric potential waveform at the other end P of the capacitive element C1 at this moment is, for example, like a waveform V1 in Part (A) of FIG. 3, and this is detected by the voltage detector DET. At the time, the electric potential of the point P is a partial pressure potential determined by the values of the currents I1 and I2 flowing through the capacitive elements C1 and C2. For this reason, the waveform V1 is a value smaller than the waveform V0 in a noncontact state. The voltage detector DET compares the detected voltage with a predetermined threshold voltage Vth, and determines that the noncontact state is established when the detected voltage is equal to or higher than this threshold voltage, and on the other hand, determines that a contact state is established when the detected voltage is lower than this threshold voltage. In this way, the touch detection is enabled.

(2. Embodiment)

[Configuration Example]

[Overall Configuration Example]

FIG. 4 illustrates a configuration example of a display panel with a touch detection function 1 according to an embodiment of the present disclosure. This display panel with a touch detection function 1 is of a so-called in-cell type, in which a liquid crystal display element is used as a display element, and a liquid crystal display device configured by using the liquid crystal display element and a capacitance-type touch detection device are integrated.

This display panel with a touch detection function 1 includes a drive section 50, a gate driver 12, a display device with a touch detection function 10, and a touch detection section 40.

The drive section 50 drives the display device with a touch detection function 10. This drive section 50 is integrated to be a chip through, for example, a silicon process, and implemented on a pixel board 2 as a so-called COG (Chip On Glass), as will be described later.

The drive section 50 includes a display control section 11, a source driver 13, a scanning section 51, a drive electrode driver 52, and a power control section 53.

The display control section 11 is a circuit that supplies a control signal to each of the source driver 13, the gate driver 12, and the touch detection section 40, based on an image signal Vdisp supplied externally, thereby controlling these elements to operate in synchronization with one another. Specifically, the display control section 11 supplies a pixel signal Vsig and a source-driver control signal to the source driver 13, supplies a gate-driver control signal to the gate driver 12, and supplies a horizontal synchronization signal Hsync and a vertical synchronization signal Vsync to the touch detection section 40.

The source driver 13 generates a pixel signal Vpix based on the pixel signal Vsig and the source-driver control signal supplied from the display control section 11, and supplies the generated signal to a pixel signal line SGL of the display device with a touch detection function 10. As will be described later, the pixel signal Vpix supplied to the pixel signal line SGL is written in pixels Pix of one row (one horizontal line) selected by the gate driver 12, among pixels Pix configured in a matrix in the display device with a touch detection function 10, and thereby display is performed.

The scanning section 51 is configured to include a shift register, and generates a plurality of scanning signals based on a TX synchronization signal Vtx supplied from the touch detection section 40, and supplies the generated signals to the drive electrode driver 52. As will be described later, the scanning signals respectively correspond to a plurality of drive electrode blocks B (to be described later) driven by the drive electrode driver 52, and thereby the drive electrode driver 52 sequentially scans and drives these drive electrode blocks B.

The drive electrode driver 52 is a circuit that supplies a drive signal Vcom to a drive electrode COML (to be described later) of the display device with a touch detection function 10, based on the scanning signal supplied from the scanning section 51. Specifically, the drive electrode driver 52 amplifies the scanning signal supplied from the scanning section 51, and generates the drive signal Vcom by performing impedance conversion. This drive signal Vcom is a signal including a pulse waveform (an AC drive signal VcomAC), and the drive electrode driver 52 applies the AC drive signal VcomAC to the drive electrodes COML in touch detection operation. In display operation, the drive electrode driver 52 applies a DC voltage (a DC drive signal VcomDC) to the drive electrodes COML. ADC voltage of this DC drive signal VcomDC is, for example, 0 V, and a high-level voltage VH of the AC drive signal VcomAC may be set at, for example, 5.5 V. As will be described later, the drive electrode driver 52 drives the drive electrodes COML for each block (the drive electrode block B to be described later) including a predetermined number of drive electrodes COML.

The power control section 53 controls power supply to each block (the display control section 11, the source driver 13, the scanning section 51, and the drive electrode driver 52) of the drive section 50, based on a display source voltage VDDD and a touch-detection source voltage VDDT which have been supplied thereto. In addition, the power control section 53 supplies the touch detection section 40 with a display power flag signal Vpd indicating whether the display source voltage VDDD is supplied. Specifically, the display power flag signal Vpd is a logic signal that is at a high level (e.g., 1.8 V) when the display source voltage VDDD is supplied, and at a low level (0V) when the display source voltage VDDD is not supplied.

The gate driver 12 has a function of sequentially selecting one horizontal line targeted for display driving of the display device with a touch detection function 10, based on the gate-driver control signal supplied from the display control section 11. Specifically, as will be described later, the gate driver 12 generates a scanning signal Vscan based on the control signal supplied from the display control section 11, and applies the scanning signal Vscan to a gate of a TFT element Tr of the pixel Pix via a scanning signal line GCL, thereby sequentially selecting one row (one horizontal line) of the pixels Pix formed in a matrix in a liquid-crystal display device 20 of the display device with a touch detection function 10, as a target for the display driving. The gate driver 12 is supplied with the display source voltage VDDD.

This gate driver 12 is formed on a TFT board 21 of the display device with a touch detection function 10 to be described later. At the time when the TFT element Tr (to be described later) of the liquid-crystal display device 20 is formed, the gate driver 12 is formed using the same process.

The display device with a touch detection function 10 is a display device with a built-in touch detection function. The display device with a touch detection function 10 has the liquid-crystal display device 20 and a touch detection device 30. The liquid-crystal display device 20 is, as will be described later, a device that performs display by sequentially scanning the horizontal lines one by one, according to the scanning signal Vscan supplied from the gate driver 12. The touch detection device 30 operates based on the above-described basic principle of the capacitance-type touch detection, and outputs the touch detection signal Vdet. This touch detection device 30 is, as will be described later, configured to perform sequential scanning according to the AC drive signal VcomAC supplied from the drive electrode driver 52, and thereby performing the touch detection.

The touch detection section 40 is a circuit that detects the presence or absence of a touch event on the touch detection device 30, based on the touch-detection control signal supplied from the display control section 11 and the touch detection signal Vdet supplied from the touch detection device 30 of the display device with a touch detection function 10, and when there is a touch event, determines its coordinates or the like in a touch detection region. The touch detection section 40 is supplied with the touch-detection source voltage VDDT.

This touch detection section 40 has a LPF (Low Pass Filter) section 42, an A/D conversion section 43, a signal processing section 44, a coordinate extraction section 45, and a touch-detection control section 46. The LPF section 42 is a low-pass analog filter that removes a high frequency component (noise component) contained in the touch detection signal Vdet supplied from the touch detection device 30, and extracts and outputs each touch component. The A/D conversion section 43 is a circuit that samples each analog signal outputted from the LPF section 42 at timing synchronized with the AC drive signal VcomAC, and converts the analog signal into a digital signal. The signal processing section 44 is a logical circuit that detects the presence or absence of a touch event on the touch detection device 30, based on an output signal of the A/D conversion section 43. The coordinate extraction section 45 is a logical circuit that determines, when the touch event is detected in the signal processing section 44, its touch-panel coordinates. The touch-detection control section 46 controls the LPF section 42, the A/D conversion section 43, the signal processing section 44, and the coordinate extraction section 45, to operate in synchronization with one another, based on the horizontal synchronization signal Hsync and the vertical synchronization signal Vsync supplied from the display control section 11. In addition, the touch-detection control section 46 also has a function of generating the TX synchronization signal Vtx, based on the horizontal synchronization signal Hsync and the vertical synchronization signal Vsync, and supplying the generated signal to the scanning section 51. This TX synchronization signal Vtx is, for example, a logic signal changing between a low level (e.g., 0 V) and a high-level (e.g., 1.8 V). Specifically, when the display power flag signal Vpd is at a high level, the touch-detection control section 46 generates the TX synchronization signal Vtx, based on the horizontal synchronization signal Hsync and the vertical synchronization signal Vsync supplied from the display control section 11, and when the display power flag signal Vpd is at a low level, the touch-detection control section 46 generates the TX synchronization signal Vtx by itself.

[Display Device with Touch Detection Function 10]

Next, a configuration example of the display device with a touch detection function 10 will be described in detail.

FIG. 5 illustrates an example of a cross-sectional structure of a main part in the display device with a touch detection function 10. This display device with a touch detection function 10 includes the pixel board 2, an opposite board 3 disposed to face this pixel board 2, and a liquid crystal layer 6 interposed between the pixel board 2 and the opposite board 3.

The pixel board 2 has a TFT board 21 serving as a circuit board, the drive electrodes COML, and pixel electrodes 22. The TFT board 21 functions as a circuit board where various electrodes, wires, thin film transistors (TFTs), and the like are formed. The TFT board 21 is made of, for example, glass. Formed on the TFT board 21 are the drive electrodes COML. The drive electrode COML is an electrode to supply a voltage common to the pixels Pix (to be described later). This drive electrode COML functions as a common drive electrode for liquid-crystal-display operation, and also functions as a drive electrode for touch detection operation. Formed on the drive electrodes COML is an insulating layer 23, and the pixel electrodes 22 are formed on the insulating layer 23. The pixel electrode 22 is an electrode to supply a pixel signal for display, and has translucency. The drive electrode COML and the pixel electrode 22 are made of, for example, ITO (Indium Tin Oxide).

The opposite board 3 has a glass substrate 31, a color filter 32, and touch detection electrodes TDL. The color filter 32 is formed on one surface of the glass substrate 31. This color filter 32 is configured, for example, by periodically arranging color filter layers of three colors of red (R), green (G), and blue (B), and one set of the three colors of R, G, and B is associated with each display pixel. Formed on the other surface of the glass substrate 31 are the touch detection electrodes TDL. The touch detection electrode TDL is an electrode made of, for example, ITO, and has translucency. On this touch detection electrode TDL, a polarizing plate 35 is disposed.

The liquid crystal layer 6 functions as a display functional layer, and modulates light passing therethrough according to the state of an electric field. This electric field is formed by a potential difference between a voltage of the drive electrode COML and a voltage of the pixel electrode 22. A liquid crystal in a transverse electric field mode, such as FFS (Fringe Field Switching) and IPS (In Plane Switching) is used in the liquid crystal layer 6.

It is to be noted that each of between the liquid crystal layer 6 and the pixel board 2, and between the liquid crystal layer 6 and the opposite board 3, an oriented film is disposed, and an incidence-side polarizing plate is disposed on the undersurface side of the pixel board 2, but the illustration is omitted here.

FIG. 6 illustrates a configuration example of a pixel structure in the liquid-crystal display device 20. The liquid-crystal display device 20 has the pixels Pix arranged in a matrix. Each of the pixels Pix is configured to include three subpixels SPix. These three subpixels SPix are arranged to correspond to the three colors (RGB) of the color filter 32 illustrated in FIG. 5, respectively. The subpixel SPix has the TFT element Tr and a liquid crystal element LC. The TFT element Tr is configured by using a thin-film transistor and, in this example, configured by using an n-channel MOS (Metal Oxide Semiconductor) TFT. Of the TFT element Tr, a source is connected to the pixel signal line SGL, a gate is connected to the scanning signal line GCL, and a drain is connected to one end of the liquid crystal element LC. As for the liquid crystal element LC, one end is connected to the drain of the TFT element Tr, and the other end is connected to the drive electrode COML.

The subpixel SPix is connected to other subpixels SPix belonging to the same row of the liquid-crystal display device 20, by the scanning signal line GCL. The scanning signal line GCL is connected to the gate driver 12, and supplied with the scanning signal Vscan from the gate driver 12. In addition, the subpixel SPix is connected to other subpixels SPix belonging to the same column of the liquid-crystal display device 20, by the pixel signal line SGL. The pixel signal line SGL is connected to the source driver 13, and supplied with the pixel signal Vpix from the source driver 13.

Further, the subpixel SPix is connected to other subpixels SPix belonging to the same row of the liquid-crystal display device 20, by the drive electrode COML. The drive electrode COML is connected to the drive electrode driver 52, and supplied with the drive signal Vcom from the drive electrode driver 52.

With this configuration, in the liquid-crystal display device 20, the gate driver 12 drives the scanning signal line GCL to perform the line sequential scanning time-divisionally, and thereby one horizontal line is selected sequentially, and the pixels Pix belonging to the selected one horizontal line are supplied with the pixel signal Vpix from the source driver 13, and thereby display is performed for every one horizontal line.

FIG. 7 illustrates a configuration example of the touch detection device 30 perspectively. The touch detection device 30 is configured to include the drive electrodes COML provided at the pixel board 2, and the touch detection electrodes TDL provided at the opposite board 3. The drive electrode COML is configured to have stripe-shaped electrode pattern extending in a lateral direction of this figure. When touch detection operation is performed, the AC drive signal VcomAC is sequentially supplied from the drive electrode driver 52 to the electrode pattern, and sequential scanning driving is performed in a time-sharing manner, as will be described later. The touch detection electrode TDL is configured to have stripe-shaped electrode pattern extending in a direction orthogonal to the direction in which the electrode pattern of the drive electrode COML extend. The electrode pattern of the touch detection electrode TDL is connected to the LPF section 42 of the touch detection section 40. The electrode patterns of the drive electrode COML and the touch detection electrode TDL crossing each other form a capacitance at the intersection.

By this configuration, in the touch detection device 30, when the drive electrode driver 52 applies the AC drive signal VcomAC to the drive electrode COML, the touch detection signal Vdet is outputted from the touch detection electrode TDL, and thereby the touch detection is performed. In other words, the drive electrode COML corresponds to the drive electrode E1, and the touch detection electrode TDL corresponds to the touch detection electrode E2, in the basic principle of the touch detection illustrated in Part (A) of FIG. 1 to Part (B) of FIG. 3, and thus, the touch detection device 30 detects a touch event in accordance with this basic principle. As illustrated in FIG. 7, the electrode patterns intersecting each other form the capacitance-type touch sensor in a matrix. Therefore, it is also possible to detect a position where a touch or an approach of an external proximity object has occurred, by scanning an entire touch detection surface of the touch detection device 30.

FIGS. 8A to 8C schematically illustrate touch detection scanning. FIGS. 8A to 8C illustrate operation of applying the AC drive signal VcomAC to each of drive electrode blocks B1 to B20, in a case where a display region/touch detection region includes the twenty drive electrode blocks B1 to B20. A drive-signal-applied block BAC indicates the drive electrode block B to which the AC drive signal VcomAC is applied, and the DC drive signal VcomDC is applied to other drive electrode blocks B. As illustrated in FIGS. 8A to 8C, the drive electrode driver 52 sequentially selects the drive electrode block B targeted for the touch detection operation, applies the AC drive signal VcomAC thereto, and scans all the drive electrode blocks B. At the time, as will be described later, the drive electrode driver 52 applies the AC drive signal VcomAC to each of the drive electrode blocks B over a predetermined number of horizontal periods. It is to be noted that, in this example, the number of the drive electrode blocks B is twenty for convenience of description, but is not limited to this number.

[Implementation Example of Display Panel with Touch Detection Function 1)

FIG. 9 schematically illustrates an implementation example of the display panel with a touch detection function 1. As illustrated in FIG. 9, the drive section 50 is implemented as the COG on the pixel board 2, and connected to each of the drive electrode blocks B arranged side by side via a wire L. In this example, the wires L are provided on an upper side and a lower side of the drive electrode blocks B in FIG. 9, and the drive section 50 is allowed to drive each of the drive electrode blocks B from both sides. Then, the gate driver 12 (12A and 12B) is formed on the TFT board 21 by using a TFT element, and connected to the drive section 50. In this example, the gate driver 12 is disposed on an upper side (12A) and a lower side (12B) of the pixel board 2 in FIG. 9, and is allowed to drive the pixels Pix (not illustrated) disposed in a matrix in a display region Ad, from both sides. Further, the touch detection section 40 is implemented on a flexible printed circuit board T, and connected to each of the touch detection electrodes TDL arranged side by side.

As illustrated in FIG. 9, this drive section 50 is disposed on a side (the right side) of the pixel board 2 which is different from the sides where the gate drivers 12A and 12B are disposed, in the display panel with a touch detection function 1. This allows the length of the wire L to be made short, and makes it easy for the drive section 50 to drive the drive electrode block B, compared to a case where the drive section 50 is disposed on the flexible printed circuit board T, for example.

It is to be noted that, in this example, the wires L are disposed on the upper side and the lower side of the drive electrode blocks B in FIG. 9, but are not limited to this example, and may be provided only on one of the upper side and the lower side of the drive electrode blocks B. Similarly, in this example, the two gate drivers 12A and 12B are provided, but this is not a limitation, and a configuration in which only one of these gate drivers is provided may be adopted.

Here, the liquid crystal element LC corresponds to a specific example of "display element" in the present disclosure. The AC drive signal VcomAC corresponds to a specific example of "drive signal" in the present disclosure. The scanning section 51 and the drive electrode driver 52 correspond to a specific example of "electrode drive section" in the present disclosure. The display control section 11 and the source driver 13 correspond to a specific example of "display drive section" in the present disclosure. The horizontal synchronization signal Hsync and the vertical synchronization signal Vsync correspond to a specific example of "display synchronization signal" in the present disclosure. The TX synchronization signal Vtx corresponds to a specific example of "touch-detection synchronization signal" in the present disclosure.

[Operation and Function]

Next, there will be described the operation and function of the display panel with a touch detection function 1 in the present embodiment.

First, a summary of the entire operation of the display panel with a touch detection function 1 will be described with reference to FIG. 4. Based on the image signal Vdisp supplied externally, the display control section 11 supplies the control signal to each of the gate driver 12, the source driver 13, and the touch detection section 40, thereby controlling these elements to operate in synchronization with one another. The gate driver 12 supplies the scanning signal Vscan to the liquid-crystal display device 20, thereby sequentially selecting one horizontal line targeted for display driving. The source driver 13 generates the pixel signal Vpix, and supplies the generated signal to each of the subpixels SPix of one horizontal line. The liquid crystal display device 20 of the display device with a touch detection function 10 performs display operation.

Based on the horizontal synchronization signal Hsync and the vertical synchronization signal Vsync supplied from the display control section 11, the touch-detection control section 46 of the touch detection section 40 generates the TX synchronization signal Vtx. The scanning section 51 generates the scanning signal based on this TX synchronization signal Vtx, and the drive electrode driver 52 generates the drive signal Vcom based on this scanning signal and supplies the generated signal to the drive electrode COML of the touch detection device 30 in the display device with a touch detection function 10. Based on the drive signal Vcom, the touch detection device 30 outputs the touch detection signal Vdet from the touch detection electrode TDL. The LPF section 42 of the touch detection section 40 removes the high frequency component (noise component) contained in the touch detection signal Vdet, and extracts and outputs the touch component. The A/D conversion section 43 converts the analog signal outputted from the LPF section 42 into the digital signal. The signal processing section 44 detects the presence or absence of a touch event on the display device with a touch detection function 10, based on the output signal of the A/D conversion section 43. When the touch detection is performed in the signal processing section 44, the coordinate extraction section 45 determines its touch-panel coordinates.

The power control section 53 of the drive section 50 controls the power supply to each of the blocks in the drive section 50, based on the display source voltage VDDD and the touch-detection source voltage VDDT supplied thereto.

[Detailed Operation]

Next, detailed operation of the display panel with a touch detection function 1 will be described.

Parts (A) to (H) of FIG. 10 illustrate timing waveform examples of the display panel with a touch detection function 1, namely, Part (A) indicates a waveform of the vertical synchronization signal Vsync, Part (B) indicates a waveform of the horizontal synchronization signal Hsync, Part (C) indicates waveforms of the scanning signal Vscan, Part (D) indicates a waveform of the pixel signal Vsig, Part (E) indicates waveforms of the pixel signal Vpix, Part (F) indicates a waveform of the TX synchronization signal Vtx, Part (G) indicates a waveform of the drive signal Vcom, and Part (H) indicates a waveform of the touch detection signal Vdet.

In the display panel with a touch detection function 1, the touch detection operation and the display operation are carried out in each one horizontal period (1H). In the display operation, the gate driver 12 sequentially applies the scanning signal Vscan to the scanning signal line GCL, thereby performing the display scanning. In the touch detection operation, the drive electrode driver 52 sequentially applies the AC drive signal VcomAC to each of the drive electrode blocks B, thereby performing the touch detection scanning, and the touch detection section 40 detects the touch event based on the touch detection signal Vdet outputted from the touch detection electrode TDL. The details will be described below.

First, at timing t0, the display control section 11 generates a pulse as the horizontal synchronization signal Hsync, and supplies the generated pulse to the touch-detection control section 46 (Part (B) of FIG. 10). As a result, one horizontal period begins. Further, at this timing t0, the display control section 11 generates a pulse having a width corresponding to the one horizontal period, and supplies this pulse to the touch-detection control section 46 similarly (Part (A) of FIG. 10). In other words, in this example, one frame period (1F) starts at the timing t0.

Next, in a period of timings t1 to t2, the touch-detection control section 46 generates a pulse as the TX synchronization signal Vtx (Part (F) of FIG. 10). In response to this, the scanning section 51 of the drive section 50 selects the drive electrode block B related to the touch detection operation (here, the kth drive electrode block B(k)), and generates a pulse as the scanning signal corresponding to the drive electrode block B(k). The drive electrode driver 52 amplifies this scanning signal, and also performs the impedance conversion, thereby generating and applying a pulse (the AC drive signal VcomAC) as the drive signal Vcom (B(k)) to the drive electrode block B(k) (Part (G) of FIG. 10). This AC drive signal VcomAC is transmitted to the touch detection electrode TDL through the capacitance, and the touch detection signal Vdet changes (Part (H) of FIG. 10). Then, at sampling timing ts, the A/D conversion section 43 of the touch detection section 40 performs A/D conversion of the output signal of the LPF section 42 to which this touch detection signal Vdet has been inputted (Part (H) of FIG. 10). The signal processing section 44 of the touch detection section 40 performs the touch detection, based on a result of this A/D conversion collected over a plurality of horizontal periods, as will be described later.

Next, at timing t3, the gate driver 12 applies the scanning signal Vscan to the scanning signal line GCL(n) in the nth row related to the display operation, and the scanning signal Vscan(n) changes from a low level to a high level (Part (C) of FIG. 10). Then, the source driver 13 applies the pixel signal Vpix to the pixel signal line SGL (Part (E) of FIG. 10), and the display of the pixels Pix of the one horizontal line related to the scanning signal line GCL(n) in the nth row is performed.

Specifically, at first, the gate driver 12 changes the scanning signal Vscan(n) from the low level to the high level at the timing t3, thereby selecting the one horizontal line related to the display operation. Then, the display control section 11 supplies the source driver 13 with a pixel voltage VR for a red subpixel SPix, as the pixel signal Vsig (Part (D) of FIG. 10). The source driver 13 separates the pixel voltage VR supplied by the display control section 11, from the pixel signal Vsig, and supplies the pixel voltage VR as a pixel signal VpixR to the red subpixel SPix related to the one horizontal line, through the pixel signal line SGL (Part (E) of FIG. 10). Similarly, the display control section 11 supplies the source driver 13 with a pixel voltage VG for a green subpixel SPix as the pixel signal Vsig (Part (D) of FIG. 10), and the source driver 13 separates this pixel voltage VG from the pixel signal Vsig, and supplies the pixel voltage VG as a pixel signal VpixG to a green subpixel SPix related to the one horizontal line (Part (E) of FIG. 10). Afterwards, similarly, the display control section 11 supplies the source driver 13 with a pixel voltage VB for a blue subpixel SPix (Part (D) of FIG. 10), and the source driver 13 separates this pixel voltage VB from the pixel signal Vsig, and supplies the pixel voltage VB as a pixel signal VpixB to a blue subpixel SPix related to the one horizontal line (Part (E) of FIG. 10).

Next, at timing t4, the gate driver 12 changes the scanning signal Vscan(n) of the scanning signal line GCL in the nth row from the high level to the low level (Part (C) of FIG. 10). This electrically isolates the subpixel SPix of the one horizontal line related to the display operation, from the pixel signal line SGL.

Afterwards, in the display panel with a touch detection function 1, by repeating the operation described above, the display operation in the entire display screen is performed by the line-sequential scanning, and also the touch detection operation in the entire touch detection region is carried out by performing the scanning for each of the drive electrode blocks B, as will be described below.

Parts (A) to (D) of FIG. 11 illustrate an operation example of the touch detection scanning, namely, Part (A) illustrates a waveform of the vertical synchronization signal Vsync, Part (B) illustrates a waveform of the TX synchronization signal Vtx, Part (C) illustrates waveforms of the drive signal Vcom, and Part (D) illustrates a waveform of the touch detection signal Vdet.

As illustrated in Parts (A) to (D) of FIG. 11, the drive electrode driver 52 generates the AC drive signal VcomAC synchronized with the TX synchronization signal Vtx, and sequentially applies the generated AC drive signal VcomAC to each of the drive electrode blocks B, thereby performing the touch detection scanning for the drive electrode COML. At the time, the drive electrode driver 52 applies the AC drive signal VcomAC to each of the drive electrode blocks B over a predetermined number of horizontal periods (Part (C) of FIG. 11). The touch detection device 30 outputs the touch detection signal Vdet based on this AC drive signal VcomAC, in each of the one horizontal periods (Part (D) of FIG. 11), and the touch detection section 40 samples this touch detection signal Vdet. In the touch detection section 40, after the sampling in the last one of the predetermined number of horizontal periods is finished, the signal processing section 44 detects the presence or absence of the touch event in a region corresponding to the drive electrode block B, based on the plurality of sampling results. In this way, the touch detection is performed based on the plurality of sampling results and thus, it is possible to analyze the sampling results statistically, suppress deterioration of the S/N ratio caused by variation of the sampling results, and enhance accuracy of the touch detection.

In the display panel with a touch detection function 1, the scanning section 51 and the drive electrode driver 52 related to the touch detection operation are integrated together with the display control section 11 and the source driver 13 related to the display operation, and formed as one chip. An effect of this integration will be described below.

[Multifunctionality]

In the display panel with a touch detection function 1, the scanning section 51 and the drive electrode driver 52 are integrated to be the chip and thus, it is possible to form a more multifunctional circuit. In other words, for example, in a case where the scanning section 51 and the drive electrode driver 52 are formed on the TFT board 21 of the display device with a touch detection function 10 by using the same process as that of the TFT element Tr like the gate driver 12, processing accuracy is, for example, 3 [um] which is low, and therefore, the circuit area is large. On the other hand, in the case where the scanning section 51 and the drive electrode driver 52 are made to be one chip through a silicon process and the like, and implemented as a COG, processing accuracy is, for example, 80 [nm] which is high, and therefore, it is possible to make the circuit area smaller. In other words, in the case where the scanning section 51 and the drive electrode driver 52 are formed using the same process as that of the TFT element Tr, it is difficult to form a multifunctional circuit because of a limitation in terms of circuit area, but providing them as one chip makes it possible to form more circuits per unit area and thus allows implementation of a multifunctional circuit.

This achievement of multifunctionality allows, for example, more complicated touch detection scanning and more intricate power supply control, in the display panel with a touch detection function 1. An example thereof will be described below in detail.

Parts (A) to (D) of FIG. 12 illustrate an example of more complicated touch detection scanning, namely, Part (A) illustrates a waveform of the vertical synchronization signal Vsync, Part (B) illustrates a waveform of the TX synchronization signal Vtx, Part (C) illustrates waveforms of the drive signal Vcom, and Part (D) illustrates a waveform of the touch detection signal Vdet.

In this example, the drive electrode driver 52 applies the AC drive signal VcomAC only to the odd-numbered drive electrode blocks B (B(1), B(3), B(5), . . . ). This makes it possible to detect whether a touch is made in the touch detection region, in a short time. In other words, in Parts (A) to (D) of FIG. 11, it is possible to determine the position of the touch event in the touch detection region specifically, by sequentially driving all the drive electrode blocks B, and in this example (Parts (A) to (D) of FIG. 12), it is possible to detect only whether a touch is merely made, by sequentially driving only the odd-numbered drive electrode blocks B among all the drive electrode blocks B.

The touch detection scanning as illustrated in Parts (A) to (D) of FIG. 12 may not be realized by, for example, merely changing the waveform of a signal inputted into the shift register, in the scanning section 51 configured to perform the touch detection scanning in Parts (A) to (D) of FIG. 11. In other words, in order to perform both the scanning in Parts (A) to (D) of FIG. 11 and the scanning in Parts (A) to (D) of FIG. 12, addition of a circuit dedicated to achieve multifunctionality is desired. In the display panel with a touch detection function 1, the scanning section 51 and the drive electrode driver 52 are integrated and formed as the chip and thus, such multifunctionality may be realized with a small circuit area.

FIGS. 13A to 13C each illustrate an example of the power supply control, namely, FIG. 13A illustrates a case in which both the display operation and the touch detection operation are performed, FIG. 13B illustrates a case in which only the display operation is performed, and FIG. 13C illustrates a case in which only the touch detection operation is performed. In FIGS. 13A to 13C, blocks made in solid lines each indicate a block supplied with power, and blocks made in dashed lines each indicate a block supplied with no power.

As illustrated in FIG. 13A, when both the display source voltage VDDD and the touch-detection source voltage VDDT are supplied, the power control section 53 of the drive section 50 performs power supply to each of the blocks (the display control section 11, the source driver 13, the scanning section 51, and the drive electrode driver 52) in the drive section 50. This makes the display panel with a touch detection function 1 perform the display operation and the touch detection operation as described above.

Further, as illustrated in FIG. 13B, when only the display source voltage VDDD is supplied, the power control section 53 performs power supply to the display control section 11, the source driver 13, and the drive electrode driver 52 among the blocks in the drive section 50. At the time, the drive electrode driver 52 supplies the DC drive signal VcomDC to all the drive electrodes COML. In other words, the drive electrode driver 52 does not apply the AC drive signal VcomAC to the drive electrodes COML. Then, the source driver 13 supplies the pixel signal Vpix to one horizontal line selected by the gate driver 12. In this way, the display panel with a touch detection function 1 performs only the display operation in this case.

Furthermore, as illustrated in FIG. 13C, when only the touch-detection source voltage VDDT is supplied, the power control section 53 performs power supply to the scanning section 51 and the drive electrode driver 52 among the blocks in the drive section 50. At the time, the power control section 53 generates the display power flag signal Vpd at a low level, and supplies this signal to the touch-detection control section 46 of the touch detection section 40. Then, the touch-detection control section 46 generates the TX synchronization signal Vtx by itself, and supplies this signal to the scanning section 51. This causes the scanning section 51 and the drive electrode driver 52 to generate the drive signal Vcom, and supply this signal to the drive electrode COML. Then, the touch detection section 40 detects a touch event based on the touch detection signal Vdet according to this drive signal Vcom. In this way, the display panel with a touch detection function 1 performs only the touch detection operation in this case.

In this way, in the display panel with a touch detection function 1, the power control section 53 is provided in the drive section 50, and a function of controlling power supply is built therein and therefore, the power supply control according to its use and the like is allowed, making it possible to reduce power consumption.

[Reduction in Frame Region]

Next, a reduction in a frame region of the display panel with a touch detection function 1 will be described in comparison with a comparative example. A display panel with a touch detection function 1R according to this comparative example is configured by forming a scanning section and a drive electrode driver on a TFT board 21 of a display device with a touch detection function 10, by using the same process as that of a TFT element Tr, not as a chip of the drive section 50. Otherwise, the display panel with a touch detection function 1R is similar in configuration to the present embodiment (FIG. 4).

FIG. 14A schematically illustrates an implementation example of the display panel with a touch detection function 1 according to the present embodiment, and FIG. 14B schematically illustrates an implementation example of the display panel with a touch detection function 1R according to the comparative example.

The display panel with a touch detection function 1R includes a drive section 50R, a scanning section 51R (51RA and 51RB), and a drive electrode driver 52R (52RA and 52RB) as illustrated in FIG. 14B. The drive section 50R is configured by removing the scanning section 51 and the drive electrode driver 52 from the drive section 50 of the present embodiment. The scanning section 51R and the drive electrode driver 52R are circuits having functions equivalent to those of the scanning section 51 and the drive electrode driver 52 according to the present embodiment, and formed on the TFT board 21 of the display device with a touch detection function 10, by using the same process as that of the TFT element Tr. In this example, the scanning section 51RA and the drive electrode driver 52RA are formed between drive electrode blocks B and a gate driver 12A, and the scanning section 51RB and the drive electrode driver 52RB are formed between the drive electrode blocks B and a gate driver 12B. It is to be noted that this configuration corresponds to FIG. 15 of Japanese Unexamined Patent Application Publication No. 2009-258182. In other words, it is conceivable that in this figure, a Vcom drive circuit 9 is formed on a TFT board, using the same process as that of a TFT element.

As illustrated in FIG. 14B, in the display panel with a touch detection function 1R, the scanning section 51R and the drive electrode driver 52R are formed using the same process as that of the TFT element Tr in a manner similar to the gate driver 12, and therefore, its processing accuracy is low, resulting in a large circuit area. Thus, a width d (a width in a vertical direction in FIGS. 14A and 14B) of the display panel with a touch detection function 1R is large, as compared to the case of the present embodiment (FIG. 14A). In other words, in the display panel with a touch detection function 1R, a region (a frame region) outside a display region Ad is larger than that in the case of the present embodiment (FIG. 14A). Therefore, this may, for example, increase the size of an electronic unit provided with this display panel with a touch detection function 1R, or reduce flexibility in design of the electronic unit.

On the other hand, in the display panel with a touch detection function 1 according to the present embodiment, the scanning section 51 and the drive electrode driver 52 are integrated and formed as the chip. Therefore, the processing accuracy is high and thus, it is possible to make the circuit area small, and reduce the frame region as illustrated in FIG. 14A. This makes it possible to, for example, reduce the size of an electronic unit provided with the display panel with a touch detection function 1, or increase flexibility in design of the electronic unit.

[Effects]

As described above, in the present embodiment, the scanning section and the drive electrode driver are integrated to be provided as the one chip and thus, it is possible to realize a multifunctional circuit. This allows, for example, more complicated touch detection scanning, and more intricate power supply control.

In addition, in the present embodiment, since the scanning section and the drive electrode driver are integrated to be the one chip, and disposed on the side different from the side where the gate driver is disposed, it is possible to shorten the width of the display panel with a touch detection function, and reduce the frame region.

Further, in the present embodiment, the drive electrode driver is disposed near the drive electrode blocks and thus, it is possible to make the driving of the drive electrode blocks easy.

[Modification 1-1]

In the embodiment described above, the display source voltage VDDD and the touch-detection source voltage VDDT are supplied separately to each of the blocks of the display panel with a touch detection function 1, but this is not a limitation. Instead, for example, a common source voltage VDD may be supplied. This example will be described below in detail.

FIG. 15 illustrates a configuration example of a display panel with a touch detection function 1B according to the present modification. The display panel with a touch detection function 1B includes a drive section 50B and a touch detection section 40B. In the display panel with a touch detection function 1B, a single source voltage VDD is supplied externally and distributed to each block.

The drive section 50B has a power control section 53B. The power control section 53B controls power supply to each block (a display control section 11, a source driver 13, a scanning section 51, and a drive electrode driver 52) of the drive section 50B based on a power-supply control signal Vpow. Specifically, for example, the power-supply control signal Vpow controls the power supply to each block as in FIG. 13C when being a signal of ordering both display operation and touch detection operation, controls the power supply to each block as in FIG. 13B when being a signal of ordering only the display operation, and controls the power supply to each block as in FIG. 13C when being a signal of ordering only the touch detection operation. Further, the power control section 53B supplies the touch detection section 40B with a display power flag signal Vpd indicating whether the source voltage is supplied to the block (the display control section 11 and the source driver 13) related to the display operation, and also supplies the touch detection section 40B with a touch-detection power flag signal Vpt indicating whether the source voltage is supplied to the block (the scanning section 51) related to the touch detection operation. Specifically, this touch-detection power flag signal Vpt is a logic signal that is at a high level (e.g., 1.8 V) when the source voltage is supplied to the block related to the touch detection operation, and at a low level (0 V) when the source voltage is not supplied to this block.

The touch detection section 40B has a touch-detection control section 46B. Like the touch-detection control section 46 according to the above-described embodiment, the touch-detection control section 46B controls a LPF section 42, an A/D conversion section 43, a signal processing section 44, and a coordinate extraction section 45 to operate in synchronization with one another, based on a horizontal synchronization signal Hsync and a vertical synchronization signal Vsync, and also generates and supplies a TX synchronization signal Vtx to the scanning section 51. In addition, the touch-detection control section 46B also has a function of stopping the power supply to the LPF section 42, the A/D conversion section 43, the signal processing section 44, and the coordinate extraction section 45, when the touch-detection power flag signal Vpt is at the low level.

In this case as well, it is possible to realize a reduction in power consumption, by causing the power control section 53B to perform the power supply control based on the power-supply control signal Vpow, in the display panel with a touch detection function 1B.

[Modification 1-2]

In the above-described embodiment, the drive electrodes COML are driven and scanned for each of the drive electrode blocks B each including the predetermined number of drive electrodes COML, but this is not a limitation. Instead, for example, a predetermined number of drive electrodes COML may be driven simultaneously, and scanned by shifting through the drive electrodes COML one by one. The details will be described below.

FIGS. 16A to 16C schematically illustrate an operation example of a drive electrode driver 52C according to the present modification. The drive electrode driver 52C applies an AC drive signal VcomAC to a predetermined number of drive electrodes COML simultaneously. Specifically, the drive electrode driver 52C applies the AC drive signal VcomAC to the predetermined number (five, in this case) of drive electrodes COML simultaneously (a drive-signal-applied electrode LAC). Then, the drive electrode driver 52C performs touch detection scanning by shifting through one by one the drive electrodes COML to which the AC drive signal VcomAC is applied. It is to be noted that, in this example, the AC drive signal VcomAC is applied to the five drive electrodes COML simultaneously, but is not limited to this example. Instead, the AC drive signal VcomAC may be applied to four or less, or six or more drive electrodes COML simultaneously. Further, in this example, the scanning is performed by shifting through one by one the drive electrodes COML to which the AC drive signal VcomAC is applied, but this is not a limitation. Instead, shifting for every two or more may be performed.

[Modification 1-3]

In the embodiment described above, the touch detection section 40 and the drive section 50 are integrated into separate chips, but are not limited to this example. Instead, for example, as illustrated in FIG. 17, the touch detection section 40 and the drive section 50 may be integrated into the same chip.

[Other Modifications]

In the above-described embodiment, the drive electrode block B is configured to include the plurality of drive electrodes COML, but is not limited to this example. Instead, for example, the plurality of drive electrodes COML may be formed to be thick by being integrated, and this may be driven as the drive electrode block B.

(3. Application Examples)

Next, with reference to FIG. 18 to FIG. 22G, there will be described application examples of the display panel with a touch detection function in each of the above-described embodiment and modifications. The display panel with a touch detection function in each of the embodiment and the like may be applied to electronic units in various fields, such as television receivers, digital cameras, laptop computers, portable terminal devices such as portable telephones, and video cameras. In other words, it is possible to apply the display panel with a touch detection function in each of the embodiment and the like to electronic units in various fields, which display externally-input image signals or internally-generated image signals as still or moving images.

[Application Example 1]

FIG. 18 illustrates an external view of a television receiver to which the display panel with a touch detection function in any of the embodiment and the like is applied. This television receiver has, for example, an image display screen section 510 that includes a front panel 511 and a filter glass 512, and this video display screen section 510 is configured using the display panel with a touch detection function according to any of the embodiment and the like.

[Application Example 2]

FIGS. 19A and 19B each illustrate an external view of a digital camera to which the display panel with a touch detection function in any of the embodiment and the like is applied. This digital camera includes, for example, a flash emitting section 521, a display section 522, a menu switch 523, and a shutter release 524, and the display section 522 is configured using the display panel with a touch detection function according to any of the embodiment and the like.

[Application Example 3]

FIG. 20 illustrates an external view of a laptop computer to which the display panel with a touch detection function in any of the embodiment and the like is applied. This laptop computer includes, for example, a main section 531, a keyboard 532 for entering characters and the like, and a display section 533 that displays an image. The display section 533 is configured using the display panel with a touch detection function according to any of the embodiment and the like.

[Application Example 4]

FIG. 21 illustrates an external view of a video camera to which the display panel with a touch detection function in any of the embodiment and the like is applied. This video camera includes, for example, a main section 541, a lens 542 disposed on a front face of this main section 541 to shoot an image of a subject, a start/stop switch 543 used at the time of shooting, and a display section 544. The display section 544 is configured using the display panel with a touch detection function according to any of the embodiment and the like.

[Application Example 5]

FIGS. 22A to 22G illustrate external views of a portable telephone to which the display panel with a touch detection function in any of the embodiment and the like is applied. This portable telephone is, for example, a device in which an upper housing 710 and a lower housing 720 are connected by a coupling section (hinge section) 730, and includes a display 740, a sub-display 750, a picture light 760, and a camera 770. The display 740 or the sub-display 750 is configured using the display panel with a touch detection function according to any of the embodiment and the like.

Up to this point, the present technology has been described by using the embodiment and modifications, as well as the application examples of electronic units, but is not limited to these embodiment and the like, and may be variously modified.

For example, in the embodiment and the like, the liquid crystal display device configured by using the liquid crystal in the transverse electric field mode such as FFS and IPS, and the touch detection device are integrated. However, instead, a liquid crystal display device using a liquid crystal in various modes such as TN (Twisted Nematic), VA (Vertical Alignment), and ECB (Electrically Controlled Birefringence), and a touch detection device may be integrated. When such a liquid crystal is used, the display device with a touch detection function may be configured as illustrated in FIG. 23. FIG. 23 illustrates an example of a cross-sectional structure of a main part in a display device with a touch detection function 10E according to the present modification, and illustrates a state in which a liquid crystal layer 6B is held between a pixel board 2B and an opposite board 3B. Names, functions, and the like of all other elements are similar to those in the case of FIG. 5 and thus, the description will be omitted. In this example, unlike the case of FIG. 5, drive electrodes COML used for both display and touch detection are formed on the opposite board 3B.

Further, for example, in each of the embodiment and the like, there is employed the so-called in-cell type in which the liquid crystal display device and the capacitance-type touch detection device are integrated, but this is not a limitation. Instead, for example, there may be employed a so-called on-cell type in which a capacitance-type touch detection device is formed on a surface of a liquid crystal display device.

Furthermore, for example, in each of the embodiment and the like, the touch detection device is of capacitance type, but is not limited thereto, and may be of, for example, optical type or resistive type, instead.

Moreover, for example, in each of the embodiment and the like, the display element is the liquid crystal element, but is not limited thereto, and may be, for example, an EL (Electro Luminescence) element.

It is to be noted that the present technology may be configured as follows.

(1) A display panel with a touch detection function, the display panel including:
one or more display elements;
one or more drive electrodes extending in one direction;
an electrode drive section integrated into a chip, and applying a drive signal to the drive electrodes; and
one or more touch detection electrodes extending in a direction intersecting the direction in which the drive electrodes extend.

(2) The display panel according to (1), further including a display drive section driving the display elements,
wherein the display drive section is integrated together with the electrode drive section.

(3) The display panel according to (2), wherein the electrode drive section applies a drive signal to the drive electrodes, based on a display synchronization signal supplied from the display drive section.

(4) The display panel according to (3), further including a touch-detection control section controlling touch detection operation,
wherein the touch-detection control section generates a touch-detection synchronization signal based on the display synchronization signal, and
the electrode drive section applies the drive signal to the drive electrodes, based on the touch-detection synchronization signal.

(5) The display panel according to (4), wherein the touch-detection control section is integrated together with the electrode drive section.

(6) The display panel according to any one of (1) to (5), wherein a capacitance is formed between each of the drive electrodes and each of the touch detection electrodes, and
a detection signal according to the drive signal applied to the drive electrodes is outputted from the touch detection electrode.

(7) The display panel according to any one of (1) to (6), wherein the electrode drive section performs scanning by sequentially selecting one or more electrodes to be driven out of the drive electrodes, and applies the drive signal to the electrode to be driven.

(8) The display panel according to (7), wherein the electrode drive section has a plurality of scanning modes whose methods of sequentially selecting the electrode to be driven are different from each other.

(9) The display panel according to any one of (2) to (5), further including
a power control section controlling power supply to the electrode drive section and the display drive section, and integrated together with the electrode drive section.

(10) A display panel with a touch detection function, the display panel including:
one or more display elements;
one or more touch detection elements; and
a drive section integrated into a chip, and driving the one or more touch detection elements.

(11) A drive circuit including:
a display drive section driving one or more display elements; and
an electrode drive section integrated into a chip, and applying a drive signal to one or more drive electrodes that extend in a direction intersecting a direction in which one or more touch detection electrodes extend.

(12) An electronic unit including a display panel with a touch detection function and a control section performing operation control using the display panel, the display panel including:
one or more display elements;
one or more drive electrodes extending in a direction;
an electrode drive section integrated into a chip, and applying a drive signal to the drive electrodes; and one or more touch detection electrodes extending in a direction intersecting the direction in which the drive electrodes extend.

The present disclosure contains subject matter related to that disclosed in Japanese Priority Patent Application JP 2011-089430 filed in the Japan Patent Office on Apr. 13, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device comprising:
   a substrate;
   a plurality of first electrodes arranged on the substrate;
   a plurality of second electrodes facing the first electrodes;
   a plurality of signal lines each of which is coupled with the second electrodes;
   a drive section including
      a touch driver for a touch detection, and
      a power control section to control power supply to the touch driver on the substrate;
   a plurality of wires connecting to the first electrodes; and
   a chip being the drive section and in which the touch driver, a display drive section, and the power control section are integrated,
   wherein
      the first electrodes are connected via the wires to the chip on the substrate,
      each of the first electrodes have ends in a longitudinal direction of the first electrodes, and
      the wires that connect the first electrodes to the chip along a periphery of a display area are disposed between one end of the respective first electrodes and a gate driver, in the longitudinal direction of the first electrodes.

2. The electronic device according to claim 1, wherein the touch driver has a plurality of scanning modes whose methods of sequentially selecting the first electrodes to be driven are different from each other.

3. The electronic device according to claim 1, wherein the touch driver applies a drive signal for the touch detection to the first electrodes, based on a display synchronization signal supplied from the display drive section.

4. The electronic device according to claim 3, further comprising
   a touch-detection control section controlling a touch detection operation, wherein
      the touch-detection control section generates a touch-detection synchronization signal based on the display synchronization signal, and
      the touch driver applies the drive signal for the touch detection to the first electrodes, based on the touch-detection synchronization signal.

5. The electronic device according to claim 4, wherein the touch-detection control section is integrated together with the drive section.

* * * * *